(12) United States Patent
Flitsch

(10) Patent No.: US 10,627,809 B2
(45) Date of Patent: *Apr. 21, 2020

(54) MULTILEVEL FABRICATORS

(71) Applicant: Frederick A. Flitsch, New Windsor, NY (US)

(72) Inventor: Frederick A. Flitsch, New Windsor, NY (US)

(*) Notice: Subject to any disclaimer, the term of this patent is extended or adjusted under 35 U.S.C. 154(b) by 866 days.

This patent is subject to a terminal disclaimer.

(21) Appl. No.: 14/988,735

(22) Filed: Jan. 5, 2016

(65) Prior Publication Data

US 2016/0132045 A1  May 12, 2016

Related U.S. Application Data

(60) Continuation-in-part of application No. 14/703,552, filed on May 4, 2015, now Pat. No. 9,263,309, and a continuation-in-part of application No. 14/689,980, filed on Apr. 17, 2015, now abandoned, which is a continuation-in-part of application No. 14/134,705, filed on Dec. 19, 2013, now Pat. No. 9,159,592, which is a continuation-in-part of application No. 14/024,335, filed on Sep. 11, 2013, now Pat. No. 9,793,146, and a continuation-in-part of application No. 13/747,091, filed on Jan. 22, 2013, now (Continued)

(51) Int. Cl.
*H01L 21/67* (2006.01)
*G05B 19/418* (2006.01)
*H01L 21/677* (2006.01)

(52) U.S. Cl.
CPC .... *G05B 19/4189* (2013.01); *H01L 21/67017* (2013.01); *H01L 21/67178* (2013.01); *H01L 21/67733* (2013.01); *H01L 21/67736* (2013.01); *G05B 2219/31276* (2013.01); *G05B 2219/45031* (2013.01)

(58) Field of Classification Search
CPC ...... G05B 19/4189; G05B 2219/45031; G05B 2219/31276; H01L 21/67736; H01L 21/67733; H01L 21/67178; H01L 21/67017

See application file for complete search history.

(56) References Cited

U.S. PATENT DOCUMENTS 3,158,457 A    11/1964   Whitfield
3,588,176 A    6/1971    Byrne
(Continued)

FOREIGN PATENT DOCUMENTS

WO    2004109748 A2    12/2004

*Primary Examiner* — Sarang Afzali
*Assistant Examiner* — Ruth G Hidalgo-Hernandez
(74) *Attorney, Agent, or Firm* — Joseph p Kincart; Rogers Towers PA

(57) ABSTRACT

The present invention provides various aspects for supporting multilevel fabricators. In some examples, the multilevel fabricators may include a cleanspace region for moving work material. In some examples, panels of filters may be positioned to support the cleanspace. In some embodiments existing processing equipment and automation are placed into the new environment. In other embodiments the processing equipment is placed and new automation equipment is used. Automated tool placement equipment may be used to place the equipment. In some examples, automated tool handling equipment may be used to remove and replace processing equipment into the multilevel fabricator.

5 Claims, 17 Drawing Sheets

Related U.S. Application Data abandoned, which is a continuation-in-part of application No. 13/398,371, filed on Feb. 16, 2012, now Pat. No. 9,059,227, which is a continuation-in-part of application No. 11/933,280, filed on Oct. 31, 2007, now Pat. No. 8,641,824, which is a continuation-in-part of application No. 11/520,975, filed on Sep. 14, 2006, now Pat. No. 8,229,585, which is a continuation-in-part of application No. 11/502,689, filed on Aug. 12, 2006, now Pat. No. 9,339,900, which is a division of application No. 11/156,205, filed on Jun. 18, 2005, now Pat. No. 7,513,822.

(60) Provisional application No. 61/745,996, filed on Dec. 26, 2012, provisional application No. 61/593,501, filed on Feb. 1, 2012, provisional application No. 60/596,343, filed on Sep. 18, 2005, provisional application No. 60/596,173, filed on Sep. 6, 2005, provisional application No. 60/596,099, filed on Aug. 31, 2005, provisional application No. 60/596,053, filed on Aug. 26, 2005, provisional application No. 60/596,035, filed on Aug. 25, 2005, provisional application No. 60/595,935, filed on Aug. 18, 2005.

(56) References Cited

U.S. PATENT DOCUMENTS

| | | |
|---|---|---|
| 3,603,646 A | 9/1971 | Leoff |
| 3,812,947 A | 5/1974 | Nygaard |
| 3,930,684 A | 1/1976 | Lasch et al. |
| 3,976,330 A | 8/1976 | Babinski et al. |
| 4,081,201 A | 3/1978 | Hassan et al. |
| 4,165,132 A | 8/1979 | Hassan et al. |
| 4,267,769 A | 5/1981 | Davis et al. |
| 4,278,366 A | 7/1981 | Loveless et al. |
| 4,299,518 A | 11/1981 | Whelan |
| 4,315,705 A | 2/1982 | Flint |
| 4,348,139 A | 9/1982 | Hassan et al. |
| 4,409,889 A | 10/1983 | Burleson |
| 4,501,527 A | 2/1985 | Jacoby et al. |
| 4,554,766 A | 11/1985 | Ziemer et al. |
| 4,608,066 A | 8/1986 | Cadwell |
| 4,612,946 A | 9/1986 | Noh et al. |
| 4,620,353 A | 11/1986 | Pryor |
| 4,649,830 A | 3/1987 | Tanaka |
| 4,667,579 A | 5/1987 | Daw |
| 4,667,580 A | 5/1987 | Wetzel |
| 4,676,144 A | 6/1987 | Smith |
| 4,682,927 A | 7/1987 | Southworth et al. |
| 4,693,175 A | 9/1987 | Hashimoto |
| 4,694,736 A | 9/1987 | Yamagata et al. |
| 4,695,215 A | 9/1987 | Jacoby et al. |
| 4,699,640 A | 10/1987 | Suzuki et al. |
| 4,722,659 A | 2/1988 | Hoyt et al. |
| 4,804,392 A | 2/1989 | Spengler |
| 4,826,360 A | 5/1989 | Iwasawa et al. |
| 4,840,530 A | 6/1989 | Nguyen |
| 4,851,018 A | 7/1989 | Lazzari et al. |
| 4,861,222 A | 8/1989 | Mirkovich |
| 4,867,629 A | 9/1989 | Iwasawa et al. |
| 4,875,825 A | 10/1989 | Tullis et al. |
| 4,923,352 A | 5/1990 | Tamura et al. |
| 4,963,069 A | 10/1990 | Wurst et al. |
| 4,964,776 A | 10/1990 | Wakita et al. |
| 5,029,518 A | 7/1991 | Austin |
| 5,058,491 A | 10/1991 | Wiemer et al. |
| 5,096,477 A | 3/1992 | Shinoda et al. |
| 5,108,513 A | 4/1992 | Muller et al. |
| 5,133,561 A | 7/1992 | Hattori et al. |
| 5,139,459 A | 8/1992 | Takahashi et al. |
| 5,145,303 A | 9/1992 | Clarke |
| 5,167,575 A | 12/1992 | MacDonald |
| 5,217,273 A | 6/1993 | Hendricsen et al. |
| 5,219,464 A | 6/1993 | Yamaga et al. |
| 5,256,105 A | 10/1993 | Austin |
| 5,259,812 A | 11/1993 | Kleinsek |
| 5,326,316 A | 7/1994 | Hashimoto et al. |
| 5,344,365 A | 9/1994 | Scott et al. |
| 5,358,420 A | 10/1994 | Cairns et al. |
| 5,385,505 A | 1/1995 | Sharp et al. |
| 5,425,793 A | 6/1995 | Mori et al. |
| 5,513,946 A | 5/1996 | Sawada et al. |
| 5,518,451 A | 5/1996 | Renz et al. |
| 5,562,539 A | 10/1996 | Hashimoto et al. |
| 5,570,990 A | 11/1996 | Bonora et al. |
| 5,641,354 A | 6/1997 | Sakauchi et al. |
| 5,779,799 A | 7/1998 | Davis |
| 5,795,356 A | 8/1998 | Leveen |
| 5,827,118 A | 10/1998 | Johnson et al. |
| 5,848,933 A | 12/1998 | Roberson et al. |
| 5,860,258 A | 1/1999 | Faith et al. |
| 5,863,246 A | 1/1999 | Bujak |
| 6,040,235 A | 3/2000 | Badehi |
| 6,082,949 A | 7/2000 | Rosenquist |
| 6,091,498 A | 7/2000 | Hanson et al. |
| 6,099,599 A | 8/2000 | Wu |
| 6,138,721 A | 10/2000 | Bonora et al. |
| 6,183,358 B1 | 2/2001 | Adair |
| 6,186,723 B1 | 2/2001 | Murata et al. |
| 6,220,808 B1 | 4/2001 | Bonora et al. |
| 6,221,160 B1 | 4/2001 | Lin |
| 6,238,283 B1 | 5/2001 | Matsuyama et al. |
| 6,267,131 B1 | 7/2001 | Masada et al. |
| 6,306,189 B1 | 10/2001 | Renz |
| 6,312,525 B1 | 11/2001 | Bright et al. |
| 6,322,597 B1 | 11/2001 | Ohta |
| 6,328,768 B1 | 12/2001 | Ohta |
| 6,338,371 B1 | 1/2002 | Araki et al. |
| 6,382,895 B1 | 5/2002 | Konishi et al. |
| 6,431,948 B1 | 8/2002 | Atoh |
| 6,574,937 B1 | 6/2003 | Rapisarda et al. |
| 6,582,178 B2 | 6/2003 | Petruccelli |
| 6,591,162 B1 | 7/2003 | Martin |
| 6,598,279 B1 | 7/2003 | Morgan |
| 6,612,084 B2 | 9/2003 | Rapisarda et al. |
| 6,654,122 B1 | 11/2003 | Hanson et al. |
| 6,672,820 B1 | 1/2004 | Hanson et al. |
| 6,677,690 B2 | 1/2004 | Fosnight et al. |
| 6,694,759 B1 | 2/2004 | Bash et al. |
| 6,736,582 B1 | 5/2004 | Mages et al. |
| 6,755,221 B2 | 6/2004 | Jeong et al. |
| 6,776,850 B2 | 8/2004 | Liao et al. |
| 6,854,583 B1 | 2/2005 | Horn |
| 6,869,457 B2 | 3/2005 | Nakagawa |
| 6,875,282 B2 | 4/2005 | Tanaka et al. |
| 6,902,762 B2 | 6/2005 | Miyata |
| 6,955,595 B2 | 10/2005 | Kim |
| 7,014,672 B2 | 3/2006 | Ishihara et al. |
| 7,039,999 B2 | 5/2006 | Tarr et al. |
| 7,077,173 B2 | 7/2006 | Tokunaga |
| 7,083,515 B2 | 8/2006 | Rapisarda et al. |
| 7,216,497 B2 | 5/2007 | Hull et al. |
| 7,257,458 B1 | 8/2007 | Markle |
| 7,269,925 B2 | 9/2007 | Lam |
| 7,513,822 B2 | 4/2009 | Flitsch |
| 7,669,777 B2 | 3/2010 | Hull et al. |
| 8,029,225 B2 | 10/2011 | Meulen |
| 8,163,631 B2 | 4/2012 | Chiang et al. |
| 8,197,177 B2 | 6/2012 | Meulen et al. |
| 8,434,989 B2 | 5/2013 | Meulen |
| 8,483,883 B1 | 7/2013 | Watson |
| 8,584,349 B2 | 11/2013 | Scannon et al. |
| 8,596,312 B2 | 12/2013 | Natsume et al. |
| 8,753,063 B2 | 6/2014 | Rebstock |
| 2002/0020751 A1 | 2/2002 | Matsumoto |
| 2002/0025244 A1 | 2/2002 | Kim |
| 2002/0030113 A1 | 3/2002 | Abuzeid et al. |
| 2002/0088543 A1 | 7/2002 | Ashjaee et al. |
| 2002/0129707 A1 | 9/2002 | Tanaka et al. |
| 2002/0143656 A1 | 10/2002 | Matsuo et al. |
| 2002/0176936 A1 | 11/2002 | Matsuyama |
| 2002/0197136 A1 | 12/2002 | Huang et al. |

(56) References Cited

U.S. PATENT DOCUMENTS

| | | |
|---|---|---|
| 2003/0053894 A1 | 3/2003 | Matsumoto |
| 2003/0082030 A1 | 5/2003 | Puerto et al. |
| 2003/0091410 A1 | 5/2003 | Larson et al. |
| 2003/0101938 A1 | 6/2003 | Ronsse et al. |
| 2003/0198541 A1 | 10/2003 | Davis et al. |
| 2003/0202866 A1 | 10/2003 | Weng et al. |
| 2003/0230031 A1 | 12/2003 | Lam |
| 2004/0006544 A1 | 1/2004 | Gulett |
| 2004/0047714 A1 | 3/2004 | Poli et al. |
| 2004/0062627 A1 | 4/2004 | Aggarwal et al. |
| 2004/0081546 A1 | 4/2004 | Elliott et al. |
| 2004/0094087 A1 | 5/2004 | Ivanov et al. |
| 2004/0157463 A1 | 8/2004 | Jones |
| 2004/0187451 A1 | 9/2004 | Suzuki et al. |
| 2004/0207836 A1 | 10/2004 | Chhibber et al. |
| 2004/0225462 A1 | 11/2004 | Renken et al. |
| 2004/0226510 A1 | 11/2004 | Hanson et al. |
| 2004/0250762 A1 | 12/2004 | Shigetomi et al. |
| 2005/0005957 A1 | 1/2005 | Yamagata et al. |
| 2005/0014370 A1 | 1/2005 | Jones |
| 2006/0213842 A1 | 9/2006 | Shani et al. |
| 2007/0046284 A1 | 3/2007 | Renken et al. |
| 2008/0089765 A1 | 4/2008 | Moriya et al. |
| 2009/0326703 A1 | 12/2009 | Presley et al. |
| 2011/0245964 A1 | 10/2011 | Sullivan et al. |
| 2015/0227136 A1 | 8/2015 | Flitsch |

MULTILEVEL FABRICATORS

CROSS REFERENCE TO RELATED APPLICATIONS

This application claims priority to the U.S. patent application Ser. No. 13/747,091 filed Jan. 22, 2013 as a continuation in part. This application claims priority to the U.S. patent application Ser. No. 14/703,552 filed May 4, 2015 as a continuation in part; which in turn claims priority to the U.S. patent application Ser. No. 14/134,705 filed Dec. 19, 2013 now U.S. Pat. No. 9,159,592 issued Oct. 13, 2015; which in turn claims the benefit of the U.S. Provisional Application 61/745,996 filed Dec. 26, 2012. This application is a continuation in part of the Utility application, Ser. No. 14,689,980, filed Apr. 17, 2015 and entitled: "Method and Apparatus for Vertically Orienting Substrate Processing Tools in a Cleanspace." The application Ser. No. 14/689,980 in turn is a continuation in part of the Utility application, Ser. No. 13/398,371, filed Feb. 16, 2012 now U.S. Pat. No. 9,059,227, issued Jun. 16, 2015 and entitled: "Method and Apparatus for Vertically Orienting Substrate Processing Tools in a Cleanspace." The application Ser. No. 13/398,371 in turn is a continuation in part of the Utility application, Ser. No. 11/980,850, filed Oct. 31, 2007 and entitled: "Method and Apparatus for a Cleanspace Fabricator." The application Ser. No. 11/980,850 in turn is a Division of the Utility application, Ser. No. 11/156,205, filed Jun. 18, 2005 now U.S. Pat. No. 7,513,822, issued Apr. 7, 2009 and entitled: "Method and Apparatus for a Cleanspace Fabricator." The application Ser. No. 13/398,371 in turn is a continuation in part of the Utility application, Ser. No. 11/520,975, filed Sep. 14, 2006 now U.S. Pat. No. 8,229,585, issued Jul. 24, 2012 and entitled: "Method and Apparatus for Vertically Orienting Substrate Processing Tools in a Cleanspace." This application is a continuation in part of the U.S. patent application Ser. No. 11/502,689, filed Aug. 12, 2006 and entitled: "Method and Apparatus to support a Cleanspace Fabricator" as a continuation in part application. The U.S. patent application Ser. No. 11/502,689 in turn claims priority to the following Provisional Applications: Provisional Application, Ser. No. 60/596,343, filed Sep. 18, 2005 and entitled: "Specialized Methods for Substrate Processing for a Clean Space Where Processing Tools are Vertically Oriented"; and also Provisional Application, Ser. No. 60/596,173, filed Sep. 6, 2005 and entitled: "Method and Apparatus for Substrate Handling for a Clean Space Where Processing Tools are Reversibly Removable"; and also Provisional Application, Ser. No. 60/596,099, filed Aug. 31, 2005 and entitled: "Method and Apparatus for a Single Substrate Carrier For Semiconductor Processing"; and also Provisional Application, Ser. No. 60/596,053 filed Aug. 26, 2005 and entitled: "Method and Apparatus for an Elevator System for Tooling and Personnel for a Multilevel Cleanspace/Fabricator"; and also Provisional Application, Ser. No. 60/596,035 filed Aug. 25, 2005 and entitled: "Method and Apparatus for a Tool Chassis Support System for Simplified, Integrated and Reversible Installation of Process Tooling"; and also Provisional Application, Ser. No. 60/595,935 filed Aug. 18, 2005, and entitled: "Method and Apparatus for the Integrated, Flexible and Easily Reversible Connection of Utilities, Chemicals and Gasses to Process Tooling." The contents of these heretofore mentioned applications are relied upon and hereby incorporated by reference.

FIELD OF THE INVENTION

The present invention relates to apparatus and methods which support processing tools used in conjunction with multilevel fabricators. Support components for the multilevel fabricators are also discussed including automated tool replacement systems which support vertical and horizontal arrangement of fabricator tools operating in multilevel environments

BACKGROUND OF THE INVENTION

A known approach to advanced technology fabrication of materials such as semi-conductor substrates, is to assemble a manufacturing facility as a "cleanroom." In such cleanrooms, processing tools are arranged to provide aisle space for human operators or automation equipment. Exemplary cleanroom design is described in: "Cleanroom Design, Second Edition," edited by W. Whyte, published by John Wiley & Sons, 1999, ISBN 0-471-94204-9, (herein after referred to as "the Whyte text" and the content of which is included for reference in its entirety).

Cleanroom design has evolved over time to include locating processing stations within clean hoods. Vertical unidirectional airflow can be directed through a raised floor, with separate cores for the tools and aisles. It is also known to have specialized mini-environments which surround only a processing tool for added space cleanliness. Another known approach includes the "ballroom" approach, wherein tools, operators and automation all reside in the same cleanroom.

Evolutionary improvements have enabled higher yields and the production of devices with smaller geometries. However, known cleanroom design has disadvantages and limitations.

For example, as the size of tools has increased and the dimensions of cleanrooms have increased, the volume of cleanspace that is controlled has concomitantly increased. As a result, the cost of building the cleanspace, and the cost of maintaining the cleanliness of such cleanspace, has increased considerably.

Tool installation in a cleanroom can be difficult. The initial "fit up" of a "fab" with tools, when the floor space is relatively empty, can be relatively straightforward. However, as tools are put in place and a fabricator begins to process substrates, it can become increasingly difficult and disruptive of job flow, to either place new tools or remove old ones. Likewise it has been difficult to remove a subassembly or component that makes up a fabricator tool in order to perform maintenance or replace such a subassembly or component of the fabricator tool. It would be desirable therefore to reduce installation difficulties attendant to dense tool placement while still maintaining such density, since denser tool placement otherwise affords substantial economic advantages relating to cleanroom construction and maintenance.

Solutions to the various needs may be found in vertically oriented fabricators which incorporate a cleanspace region. The multilevel fabricators may suggest further improvements both for fabricators which include a cleanspace region and those that do not.

SUMMARY OF THE INVENTION

Accordingly there may be novel methods for operating multilevel fabricators where processing tools are oriented in a vertical fashion and occupy a peripheral location relative to regions where workproduct is moved within the fabricator. In some examples, the processing tools may be easily removed and replaced, which may be enhanced by their peripheral location. In some examples, automated equipment may be useful to remove and replace processing tools in the fabricator environment.

Accordingly, there are novel methods to define cleanspace fabricators that incorporate elements from existing manufacturing lines. In some embodiments a cleanspace fabricator may be assembled with locations for process tools and a primary cleanspace location in which automation is found to move production units from tool to tool. Into the cleanspace, tools along with their existing automation components may be moved into the cleanspace fabricator and operated. In some embodiments a multilevel cleanspace fabricator may be formed and then when tools and automation are used from an existing fabricator there may also be installed automation that can move the production units from one level to a next level. The production units may be numerous types of elements of a production process that are acted on by processing tools to produce products; sometimes these units are substrates of various shapes and sizes which may be contained in carriers of various types.

In other embodiments, only the existing process tools may be added to the cleanspace manufacturing and new automation may be designed and installed. The new automation may be of a custom design or a straight forward design of standard cleanspace manufacturing types. Production units may be processed by various methods within the retrofitted manufacturing line as the production units are moved from process tool to process tool.

In still further embodiments the process tools as well as the automation may be redesigned and then installed into the cleanspace fabricator. The processes may be similar or identical to those that are run in the existing manufacturing lines and tools. The types of production units that are moved from tool to tool can be of the similar diversity discussed above, and May also be contained in carriers of different types while moving from tool to tool. In certain embodiments of this type, the redesigned process tool may be made of a size and form factor that it may be placed in a tool pod and tool carrier type of design which leverages advantages of the cleanspace fabricator type. Since the tools are nearly all or are all located on the periphery of the cleanspace, reversible removability of the tooling is made advantageous. In still further subsets of these embodiment types, the redesigned tooling may be made smaller, may process less production units per hour because of that but may consolidate some or all of the processing steps from the existing manufacturing line into a single entity. By installing many of these redesigned units into a cleanspace fabricator, the output of the fabricator may equal or exceed that of the original manufacturing line while improving the contamination and particulate aspects all with various efficiencies afforded by the cleanspace fabricator, tool pod and tool chassis novelties.

In some embodiments, the manufacturing line may need to have both particulate and biological contamination sources eliminated from the environment. The nature of the cleanspace fabricator and the primary cleanspace together with design aspects for the processing tools and carriers may allow for embodiments that allow for efficient production of various types of production units including in a non-limiting sense biomedical devices, semiconductor devices, Microelectromechanical systems, photonic devices, testing systems and other such production products.

The present invention can therefore include methods and apparatus for retrofitting existing manufacturing lines, for redesigning existing manufacturing tooling and automation systems into a cleanspace fabricator environment and for processing production units in these fabricators.

BRIEF DESCRIPTION OF THE DRAWINGS

The accompanying drawings, that are incorporated in and constitute a part of this specification, illustrate several embodiments of the invention and, together with the description, serve to explain the principles of the invention.

DETAILED DESCRIPTION

As manufacturing lines age and as product lifecycles progress, it is possible for a cleanliness requirement for products to evolve and to require changes in the inherent aspects of production. In some cases, the changes require new replacement tooling or improved materials aspects, while in others the environment that tooling resides in needs to be upgraded. Whether the current environment is a cleanroom type of environment or not, an effect means of retrofitting the environment may be to retrofit the existing manufacturing line into a cleanspace based fabricator manufacturing line.

Figure 1:
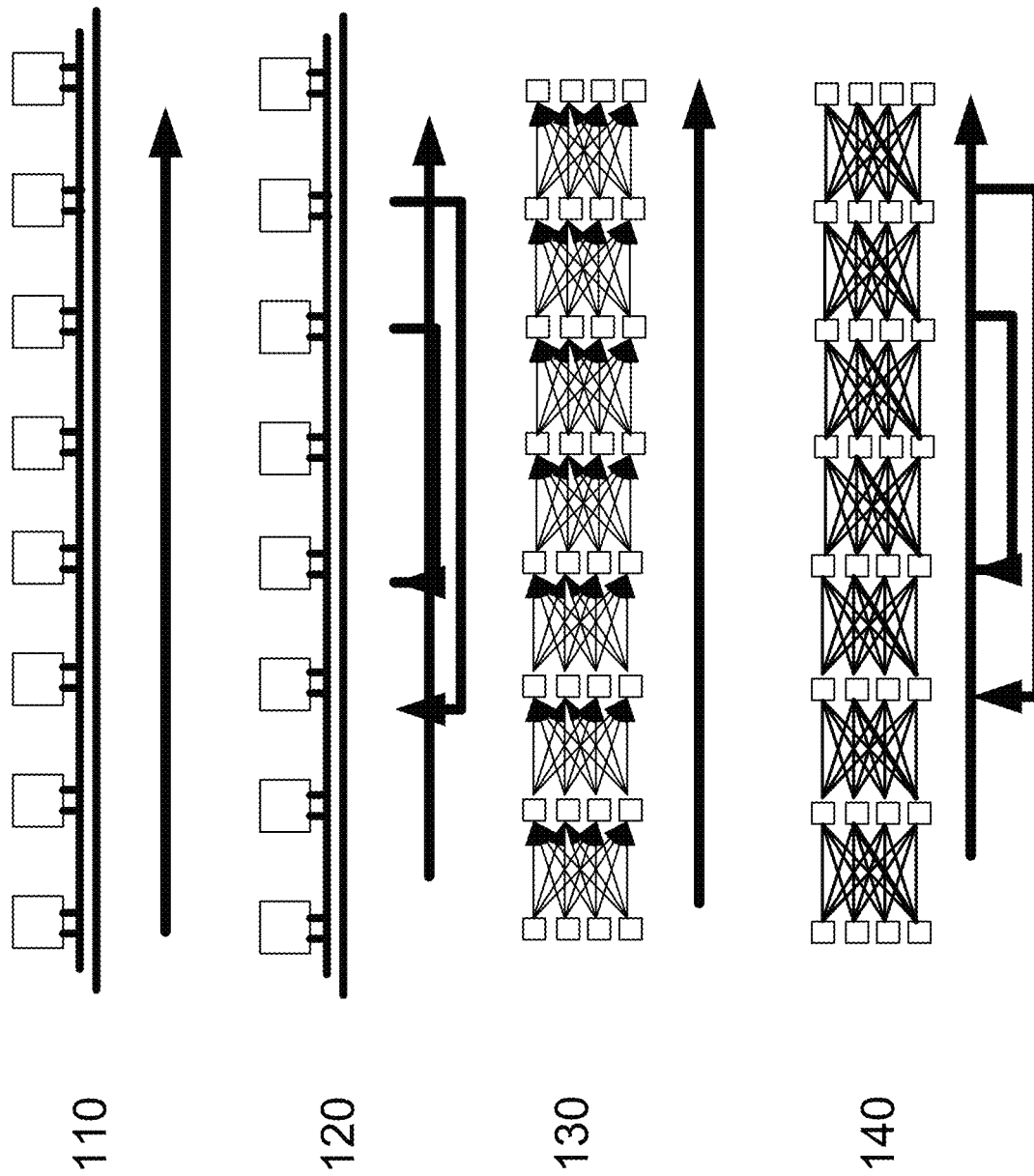
FIG. 1 Overview of exemplary types of manufacturing process flows

Proceeding to FIG. 1, item 110 demonstrates an exemplary case for manufacturing where the processing tools are located in a serial fashion. A work product is moved from one tool to the next tool after a process is complete and then by moving the work product to the end of the processing tools a complete product is obtained.

A somewhat different condition is demonstrated by item 120, where the processing tools are assembled in a serial fashion; however the automation and the processing flow entails the work product moving from certain tools back to tools that were previously involved in processing and perhaps forwards to tools not yet involved in processing. The characteristics of such a flow may allow for improved cost aspects for end products, but may result in much more complicated operational control and planning.

A different situation is again demonstrated as item 130. In this type of flow there may be multiple tools of a particular tool type, or of all tool types. When a substrate proceeds to a particular tool type it may then be processed by one of a multiple number of tools of that type. This situation as well has more complicated logistics than the first example in item 110. However, advantages in the logistical flow can be quite important. For example if one of the processing tools of a particular type is not functioning and may need to be repaired, the work flow may proceed through one of the equivalent types of tools without the significant delays that would happen in a linear processing flow with one tool at each process step.

A still further different manufacturing condition may be demonstrated by item 140 where there are multiple tools of the various types and the processing can proceed in a haphazard manner from one tool type to another until the processing is complete. This is still higher in complexity than any of the other situations discussed. There may be numerous manners to operate a production flow of this type including for example allowing any work product to go through any of the multiple tools at a particular processing step to having dedicated tools for the processing at a particular processing step in the work product flow where use of other tools is only done under special circumstances.

Figure 2:
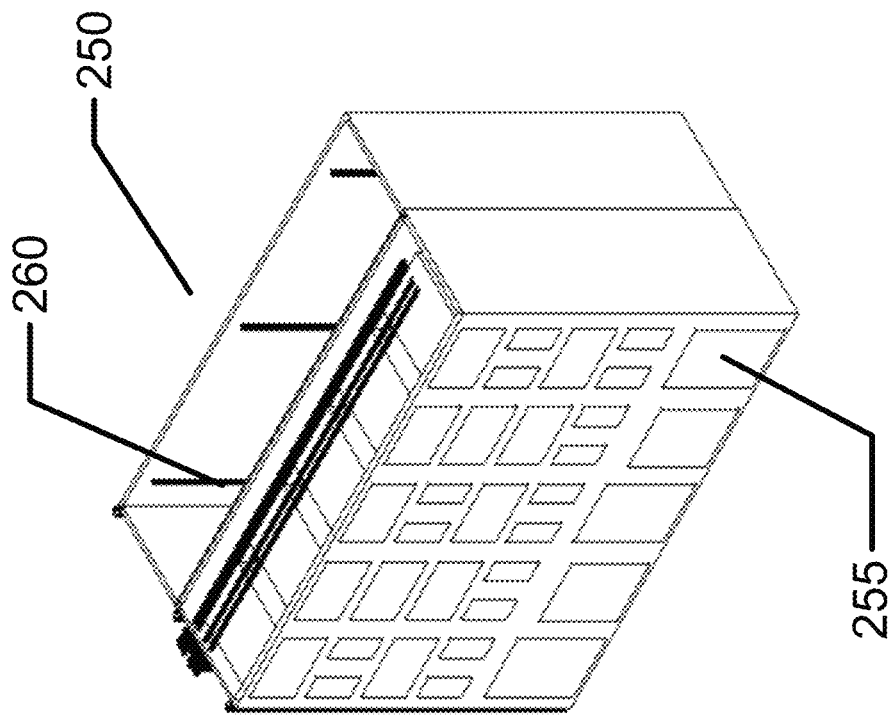
FIG. 2 illustrates an exemplary comparison of spatial layouts for some embodiments of classic manufacturing tool layout and of the cleanspace type.
Figure 2:
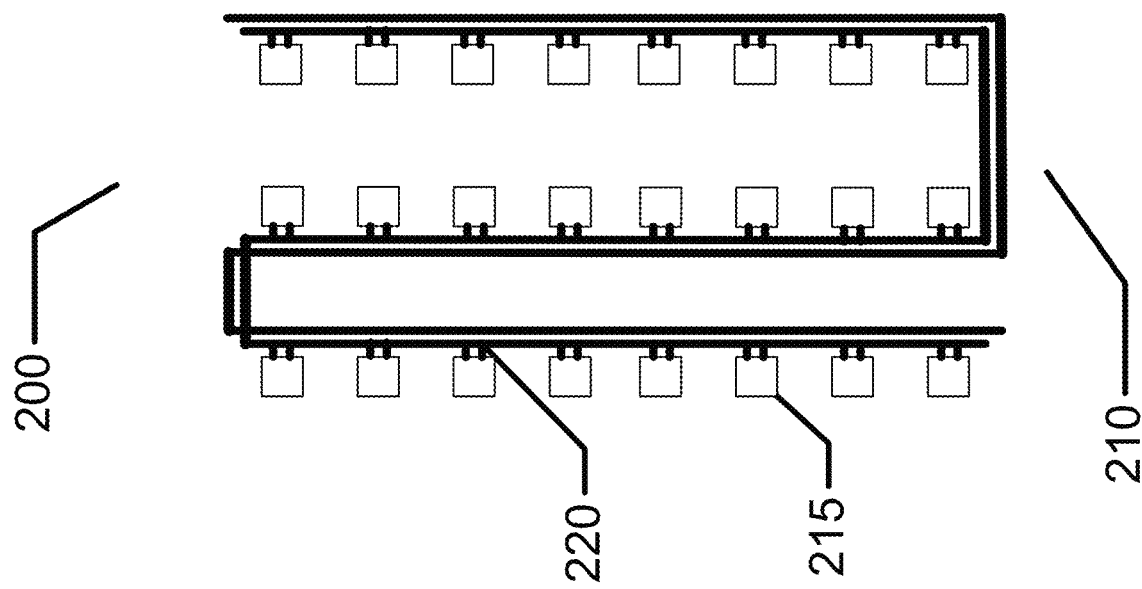

Each of these types of manufacturing flows may be consistent with retrofitting to a fabricator of a cleanspace type. As an example consider the example of item 200, FIG. 2. In this example item 210 may represent an exemplary manufacturing line of the types shown as items 110 and 120. The line may have numerous tools as for example, one of them being item 215. Furthermore, the work product may be moved from tool to tool on an automation system depicted as item 220. In an exemplary sense, it may be necessary to retrofit this manufacturing line because it may have been determined that the environment of manufacturing line 210 is of an insufficient cleanliness level. Item 250, in FIG. 2, may demonstrate one of the embodiments of a cleanspace fabricator that is a possible design to retrofit the manufacturing line into. This design would have the processing tools arranged in a matrix along vertical rows extending multiple levels in a vertical direction. The design has an efficient cleanspace for the movement of substrates from tool to tool shown as item 260. In the region of item 260 may be located automation systems that handle substrates or in some embodiments substrates inside substrate carriers. By appropriate flow of filtered air, the region may be brought to a very good cleanliness level. Furthermore, due to the nature of the design the space used for the automation and movement may be very small; a fact that allows for efficient operations and an easier environment to treat in cases where the cleanliness needs refer both to particulate forms and biological forms.

Determining the Cause of Particulates in the Manufacturing Operation

Figure 3:
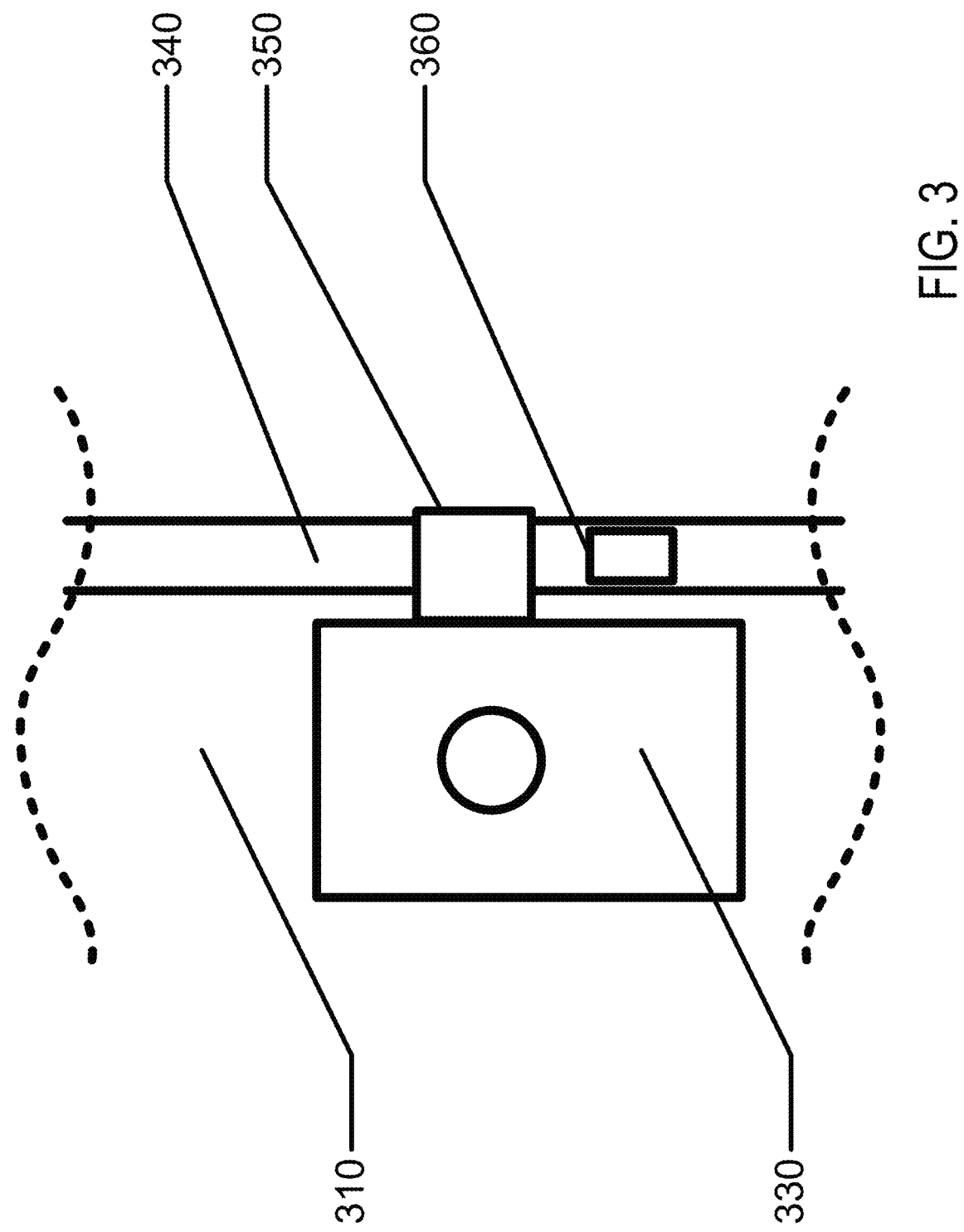
FIG. 3 illustrates a close-up of a generic processing environment including automation to move production units

Proceeding to FIG. 3, item 300 a model of a process tool in a manufacturing line is depicted. The tool, item 330, resides in an operating environment depicted as item 310. In the same environment is also located the automation system used to move work in process from tools to tools, item 340. At each of the tools in some embodiments will be a means of moving product substrates into the processing tool, an exemplary depiction of such an apparatus is shown in an exemplary manner as item 350. In some embodiments a single substrate may move from tool to tool, in other embodiments collections of substrates will move. In either case the substrates may in some embodiments be contained in a carrier as they are moved between tool to tool. For example, such a carrier may be represented as item 360 in FIG. 3.

When determining a course of upgrading the manufacturing line due to an increase in cleanliness requirements. One important step may involve determining the nature and source of the existing level of contamination that occurs in the current line. There may be many different sources of the contaminations that occur. Identifying and segregating those sources are key in determining the full nature of retrofitting needed. For example if the entire source of contamination were determined to be the environment alone, then installation of the facility into a cleanspace or cleanroom may result in an acceptable product characteristic.

Some of the likely sources to partition out may include for example, 320 the processing environment (s) of the production process. Each of these tool processing environments may inherently be contributing contaminants to the product. In this case, a change of the operating environment cleanliness may not be sufficient to yield an acceptable end result in its own right. Work would need to be performed to understand if the processing conditions and materials and the nature of the processing environments could be improved in straight forward manners or whether an entire new set of tools will also be required in addition to environment.

The automation components, like items 340, 350 and 360 may also be a major source of contamination. The system that moves carriers or substrates between tools, item 340 may generate significant levels of contamination. Or the equipment to move the carriers or substrates into the processing tool, item 350, may be a source of contaminant. Or, the container that carries the substrates or is the substrates may be a source of contaminants, item 360. In cases where the automation components add significant major source of contamination it may be possible that a retrofit to a cleanspace fabricator environment may offer an alternative means of moving substrates from tool to tool that may be attractive when compared to upgrading the existing automation equipment and materials solutions for improved cleanliness.

Except when the environment, 310, is determined to not add contaminants to the product and a "cleaner" environment is not needed, a cleanspace based fabricator may represent an ideal infrastructure as part of the solution of retrofitting manufacturing lines. In addition to being a solution that is clean, it will also be a much more compact, lower operational cost solution with lower infrastructure cost immediately as well. Furthermore, a cleanspace fabricator has the unique property where substantially all the tools exist on the periphery of the fabricator cleanspace. This provides operational advantages for a fab that may be particularly significant for smaller sized tooling.

In the following sections, description will be given to those cases where an upgrade to the environment is required. Some, exemplary solutions to the particular cases will be described with description of some embodiments of the cleanspace fabricator type. It may be apparent to one skilled in the arts, that the diversity of solutions within the various types of embodiments of cleanspace fabricators are within the scope of the inventive art herein, and are broadly included as additional alternatives.

Embodiments where Automation Exists and is Clean

Figure 4:
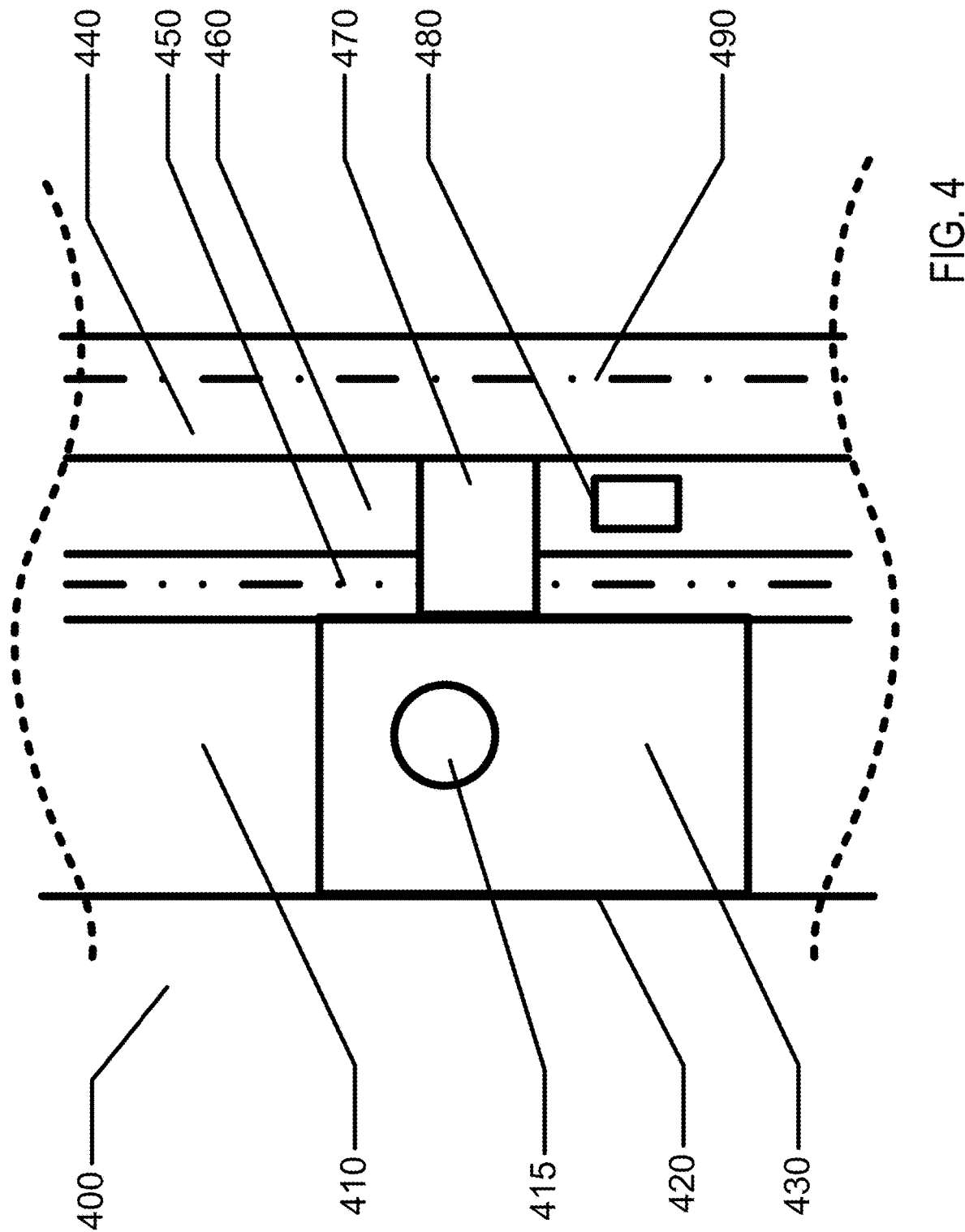
FIG. 4 illustrates a close-up of a generic processing environment including automation to move work in progress which has been incorporated into a cleanspace fabricator environment as existing.

In the case where the automation that is currently employed in a manufacturing line is sufficiently "clean" in its own right then the existing fabricator system may be included into a cleanspace fabricator in some straightforward manners. Inherently in many of these embodiments, the contamination performance of the tooling and the substrate carrier components will also be adequate for the new requirements. In such cases, and proceeding to FIG. 4, item 400 a description of how the existing tooling and automation may be incorporated into a cleanspace fabricator is shown. The depiction is a cutout view of a single tool with its automation which has now been included into a cleanspace fabricator type. Item 420 demonstrates the inclusion of a cleanspace wall or boundary on the "outside" of the process tool, item 430. On the other side, or "inside" of the process tool another cleanspace boundary, item 450 is included. The presence of these two boundaries creates a cleanspace, item 410. This cleanspace would be classified in typical embodiments as a secondary cleanspace that contains the bodies of the tools within it.

The cleanspace boundary, 450 is depicted with a dashed line. In some embodiments a flow of air will be directed through the wall or through Hepa filters mounted on the wall across a primary cleanspace 440, which involves the transport of carriers or substrates from tool to tool. The airflow will continue to a second air receiving wall or boundary of the primary cleanspace labeled as item 490. This architecture allows for a very high level of cleanliness to be defined and maintained where the substrates are moving from tool to tool.

Also, at least partially within the primary cleanspace 440, may be located the tool port, item 470 which is used to move carriers or substrates into the internal spaces of the tool body, 430. The carriers or substrates, item 480, may move along an automation system, item 460 from tool ports to tool ports. In some embodiments where the existing automation system is incorporated into the cleanspace fabricator, the movement from a tool port to a tool port may occur only in a fixed horizontal direction.

Figure 5:
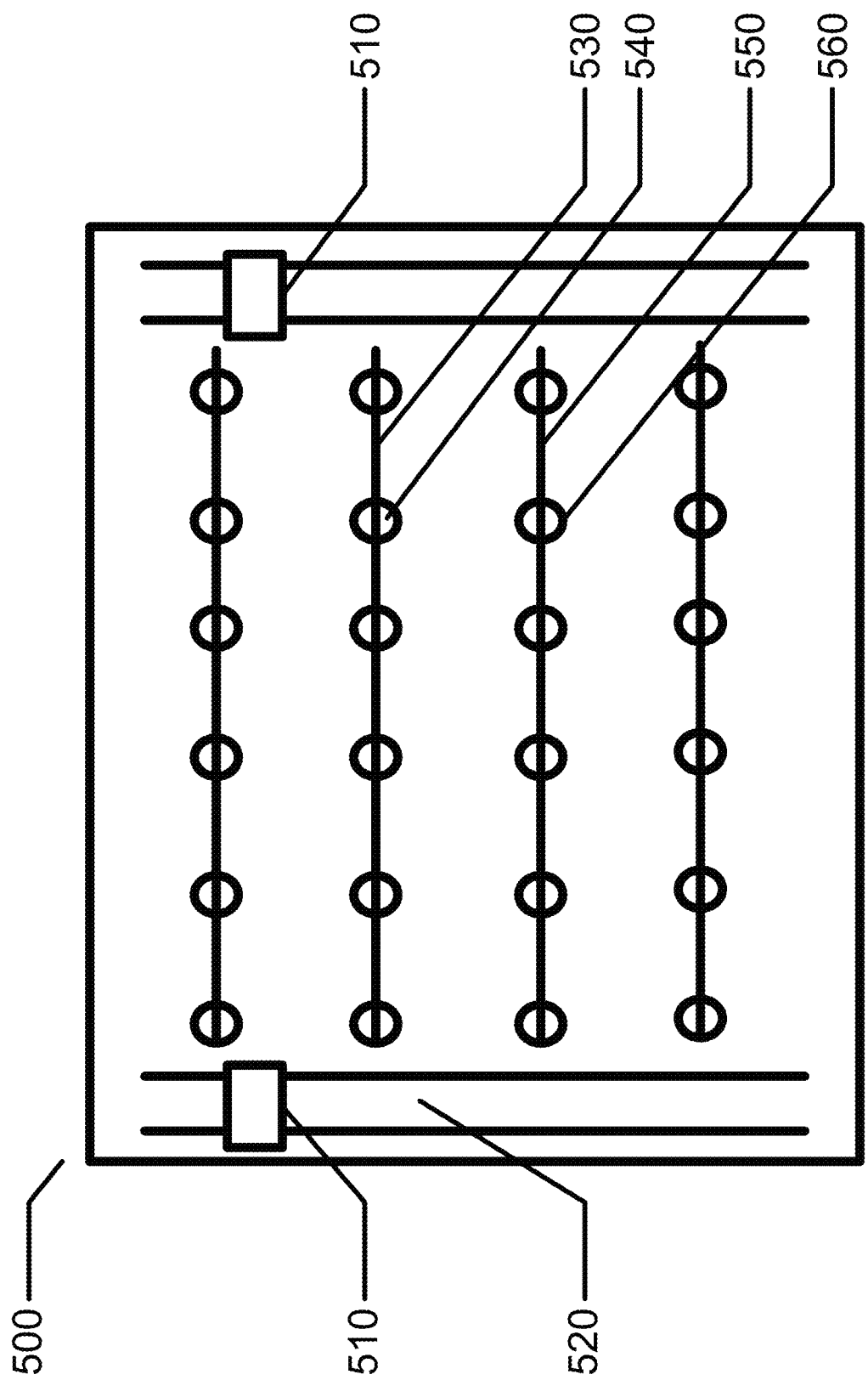
FIG. 5 illustrates an exemplary incorporation of existing processing lines into a cleanspace environment with automation between levels.

Proceeding to FIG. 5, item 500, a depiction of the deployment of processing tools into the cleanspace fabricator is shown in cross section. In some embodiments where the automation is incorporated in its existing form it may have horizontally deployed automation. The automation may be broken down into segments the length of the cleanspace as depicted by items 530 and 550. Since the processing may proceed along the horizontally deployed levels. The substrates or carriers may move along the horizontal automation systems and to a tool port for example as shown by item 540. As the processing proceeds the substrate or carrier may need to move from level 530 to level 550 for example. In some embodiments there may be an automation system that allows for the movement between levels. Examples of such intra-level automation may be depicted by the automation units identified as items 510. There may be numerous manners to move substrates or carriers between levels, and in one embodiment type the automation units may move along vertical rail systems as shown by item 510. If the substrate or carrier is moved from level 530 to 550, it may next be moved along the horizontal automation of item 550 to the toolport 560. It may be apparent to those skilled in the art that there may be numerous designs of existing manufacturing lines and automation systems and the embodiments depicted may be modified to accommodate various changes as for example there may be multiple levels to the automation or it may not be linear or other such changes. The various changes of cleanspace fabricator design to accommodate various existing line designs are intended to be within the scope of the inventive art herein.

Embodiments where Automation Contributes Significantly to Contamination

In some circumstances, analysis of the existing manufacturing line may reveal that the automation equipment contributes contamination to the environment in significant levels. In some of these cases then the placement of the manufacturing line and automation into a cleanspace may not be sufficient to result in an acceptable end product due to the contamination. The general nature of a cleanspace fabricator allows for embodiments that effectively solve this need.

Figure 6:
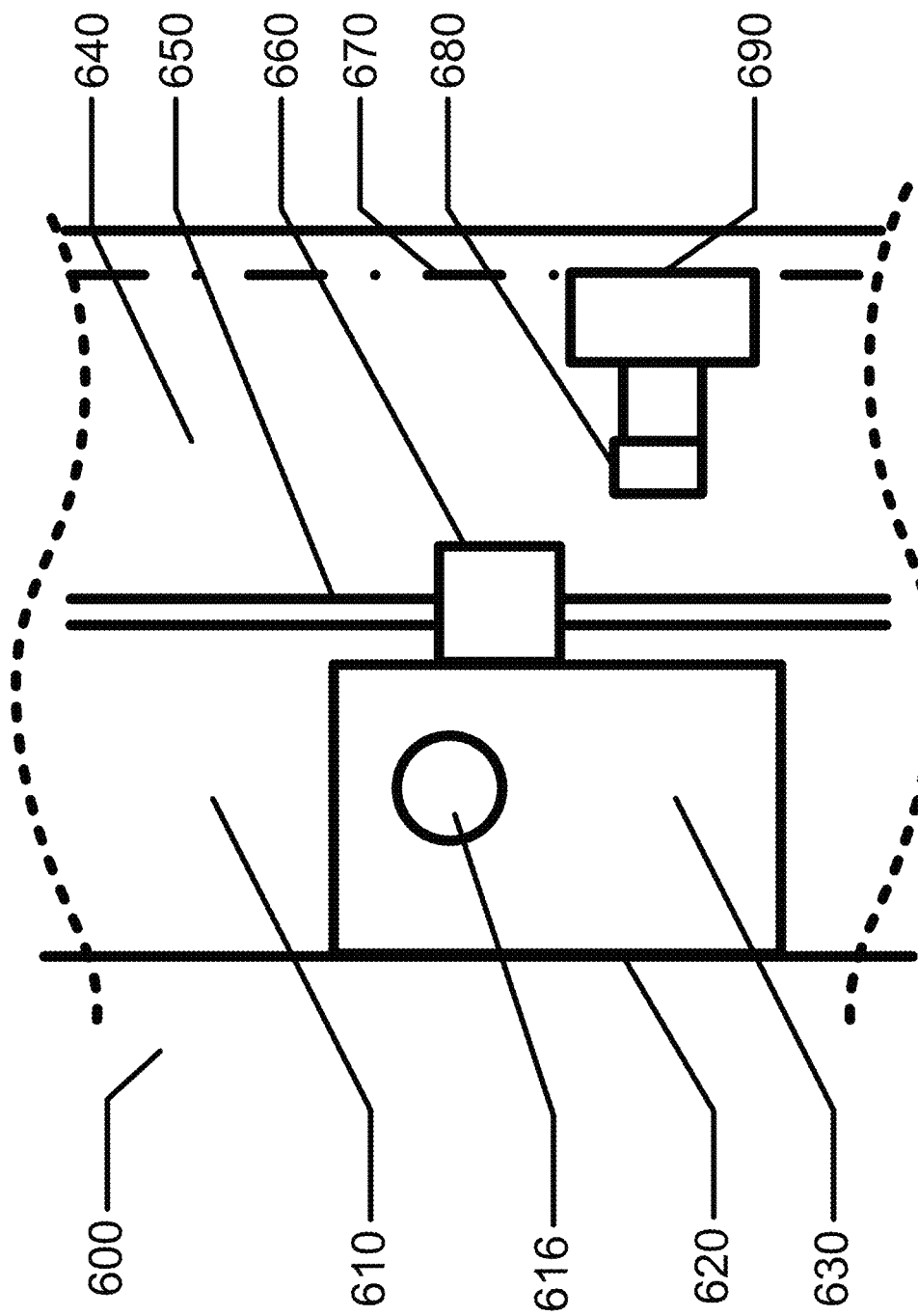
FIG. 6 illustrates a close-up of a generic processing environment including automation to move production units where the automation is made new in the cleanspace environment.

Proceeding to FIG. 6, item 600, a depiction of incorporating existing process tools into cleanspace fabricators is made. The automation system of the line, in some embodiments may be replaced with a fab-wide automation system as some cleanspace embodiments may have. As shown a process tool, item 630, may be located in a secondary cleanspace, 610, that may be located between exterior walls as for example item 620 may represent and an interior wall as 650 may represent. In some embodiments, the airflow may proceed in the primary cleanspace 640 from wall 650, which would then be an air source wall, to wall 670, which would then be an air receiving wall. In some embodiments the airflow may be characterized as a laminar flow, or in others as a uni-directional flow and in still others as a non uni-directional flow. The air may flow out of penetrations in the wall itself (In the case of the air source wall). Or, in alternatives there may be Hepa filters as part of the wall or the wall itself and the air flow may come out of the Hepa filter as it proceeds across the primary cleanspace, 640.

Referring again to FIG. 6, item 600, the fab automation system may be represented as item 690. In some embodiments the automation system may be attached to the back wall, item 670; however, numerous alternative embodiments may be possible including as a non-limiting example, the automation system being attached to the top of the multi-layer cleanspace. The automation will move a substrate or in some embodiments a carrier that contains one or more substrates, item 680, to a tool port, item 660 which is capable of receiving the substrate or carrier and move the substrate to within tool body, 630. After processing the tool body may be moved out of the tool port 660 and back to the automation system. It may be apparent that numerous alternatives to this may occur, including for example that there may be multiple ports connected to a tool body where in some embodiments, one port would act to receive substrates for the tool and the other would act to discharge substrates.

Figure 7:
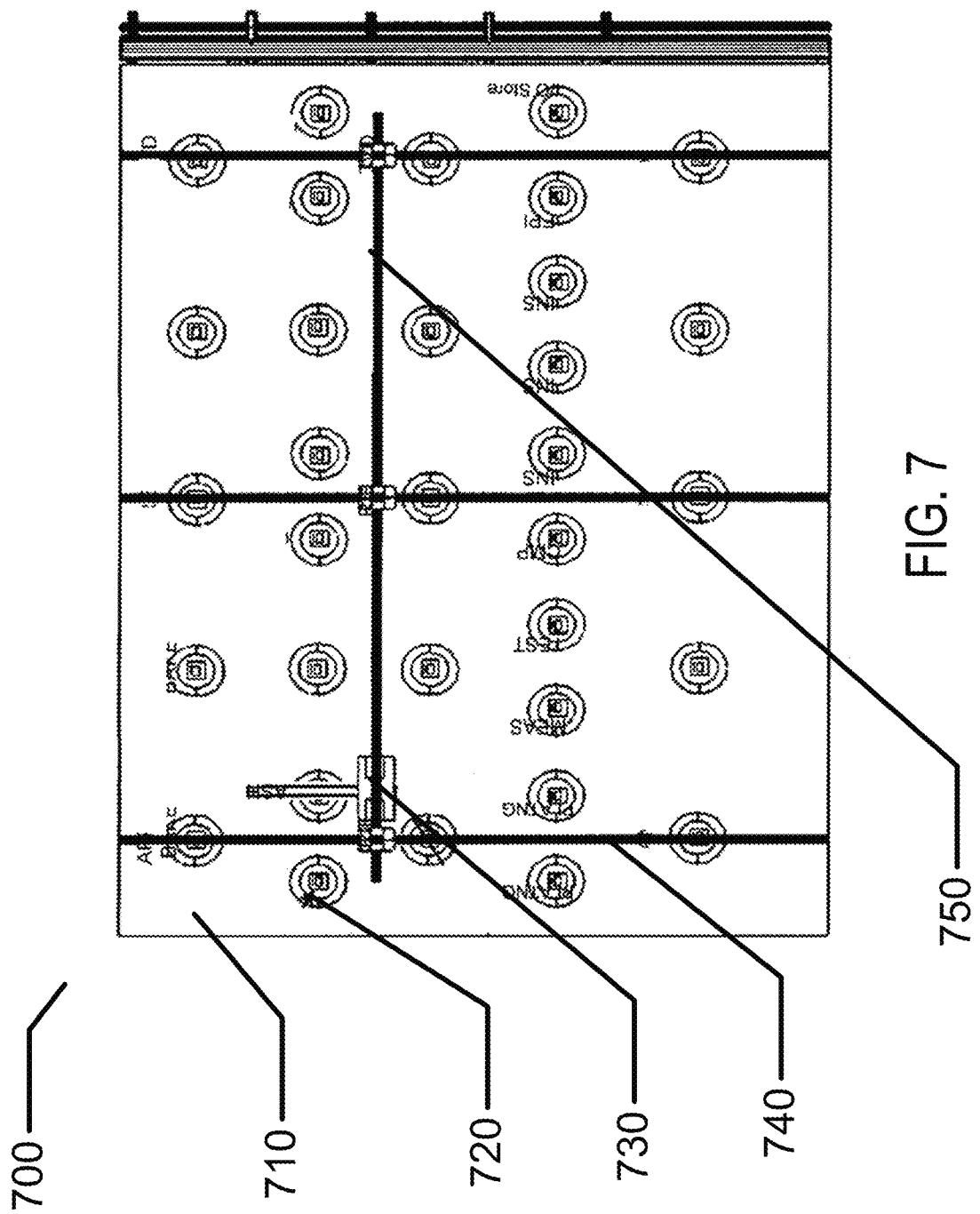
FIG. 7 illustrates an exemplary tooling layout in a cleanspace environment along with the new cleanspace environment automation to move from tool to tool

Referring to FIG. 7, item 700, a depiction of the inside of the primary cleanspace of FIG. 6 while looking at wall 650, which in this drawing is now represented in plan view as item 710, may be observed. Multiple tool ports may be represented as the round shaped features, as an example item 720. In this perspective view the automation may, in a non-limiting example embodiment, consist of linear rails that allow movement along a vertical dimension, item 740, for example and along a horizontal dimension, item 750. The automation handler that receives carriers or substrates may be identified as item 730. It may be noticed in this example that since the automation is able to address any tool port by a direct movement from a first tool port that the layout of the tool bodies and the associated location of the tool ports may be less structured as compared to previous examples. As may be apparent, there may be numerous manners to deploy tools and handle substrates within the primary cleanspace that would be consistent with the art herein.

Referring back to FIG. 6, item 600 the tool 630 may have schematically represented as item 616 a processing environment where substrates may have processes performed upon or to them. In some circumstances, an original tool from an existing manufacturing line may have a processing environment, 616, where particulates are significantly added to substrates being processed within. This may be for a number of reasons including material aspects of the processor design or other aspects of the processor design that generate or free particulates to interact with the substrate under processing. In this case, in some embodiments, this condition may cause a special case for the incorporation of manufacturing lines into cleanspaces. In some cases, just one tool may have the issue in question and it may be rebuilt or redesigned before being located in a cleanspace fabricator.

In other embodiments, it may be desirable to regenerate all of the tooling that is used in the existing manufacturing line. There may be numerous methods to perform this regeneration ranging from rebuilding the processing, automation, control or "tool-port" regions of the tool to redesigning the materials or component aspects within the processing tool. In some embodiments, it may be desirable to redesign the entire tool itself. In such cases, the design choices may include tradeoffs that incorporate aspects that improve the efficiency of a cleanspace fabricator. If the tools can be made small to process the substrate, then the incorporation of the tool pod and tool chassis aspect of some embodiments of a cleanspace fabricator may allow for the leverage of reversibly placing and removing tool bodies through the peripheral wall of the fabricator. As mentioned in prior descriptions some of which have been incorporated by reference herein, small replaceable tools may allow for efficiency of operation and the ability of a fabricator to operate with minimal staffing requirements since tools may be repaired off line or at remote locations, but the fabricator can be made operational by the placement of a functioning copy of the tool. Another advantage of smaller tools may be that there can be more units of them economically placed in the new cleanspace fabricator. As was described in item 140, FIG. 1, the multiple tools that may be flexibly used in a manufacturing flow may allow for advantages from a manufacturing perspective. Multiple paths may improve the cycle times of production and flexibility of the manufacturing processing as well for example. There may be numerous manners to incorporate a new tool design and optimize the aspect of its placement into a cleanspace fabricator for the function of performing existing manufacturing steps or perhaps improved manufacturing steps.

Multilevel Fabricator Systems

Figure 8:
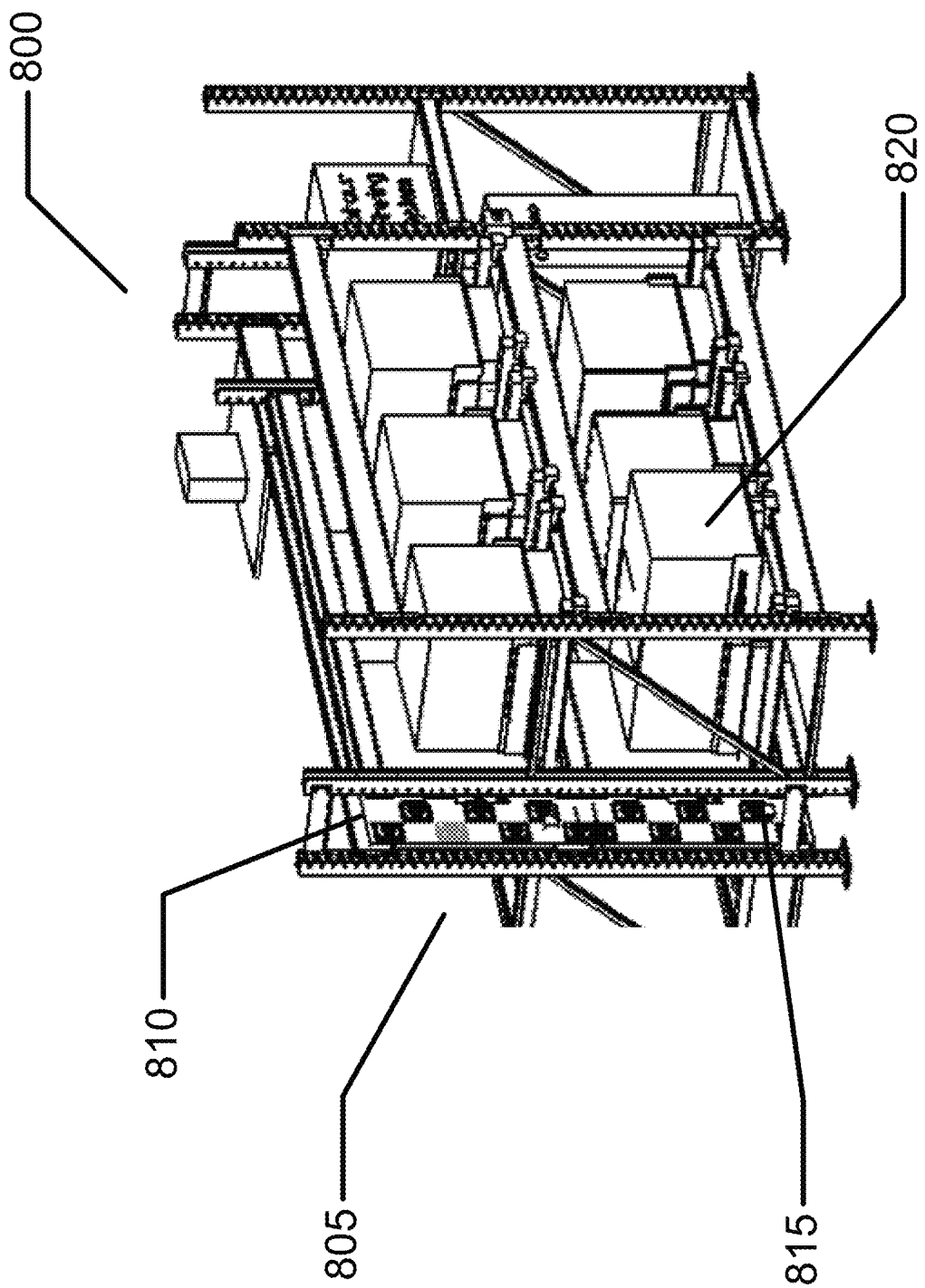
FIG. 8 illustrates an exemplary multilevel fabricator design.

Referring to FIG. 8, a closeup of a multilevel fabricator system 800 may be observed. In some examples, there may be an automation region 805 just behind the illustration. This region may be kept clean as a cleanspace in some examples. In other examples, the region may just be used for automation to move work pieces from the tool port of one processing tool to the tool port of another processing tool. The processing tools are illustrated for example in the region of processing tool 820. Especially for examples where the automation region may be kept clean, air may be directed in a horizontal manner through filter panels in the air source region 810. In some examples, processing tools may share a common tool port size and relative location to the body of the tool. In these examples, standard panels may be used that incorporate hepa filters 815. In other examples, a customized panel may be formed that places an opening for the tool port at a customized location.

The Hepa filter panel may include varying density of Hepa filter modules such as shown at 815. In the illustration, roughly 50% of the panel surface area is covered with Hepa filters. In some examples, it may be desirable to include approximately full or 100% coverage of the panel surface. In other examples, fewer filters may be employed or the panels may just emit filtered air from holes in its surface or from fixture to emit from its surface.

Figure 9:
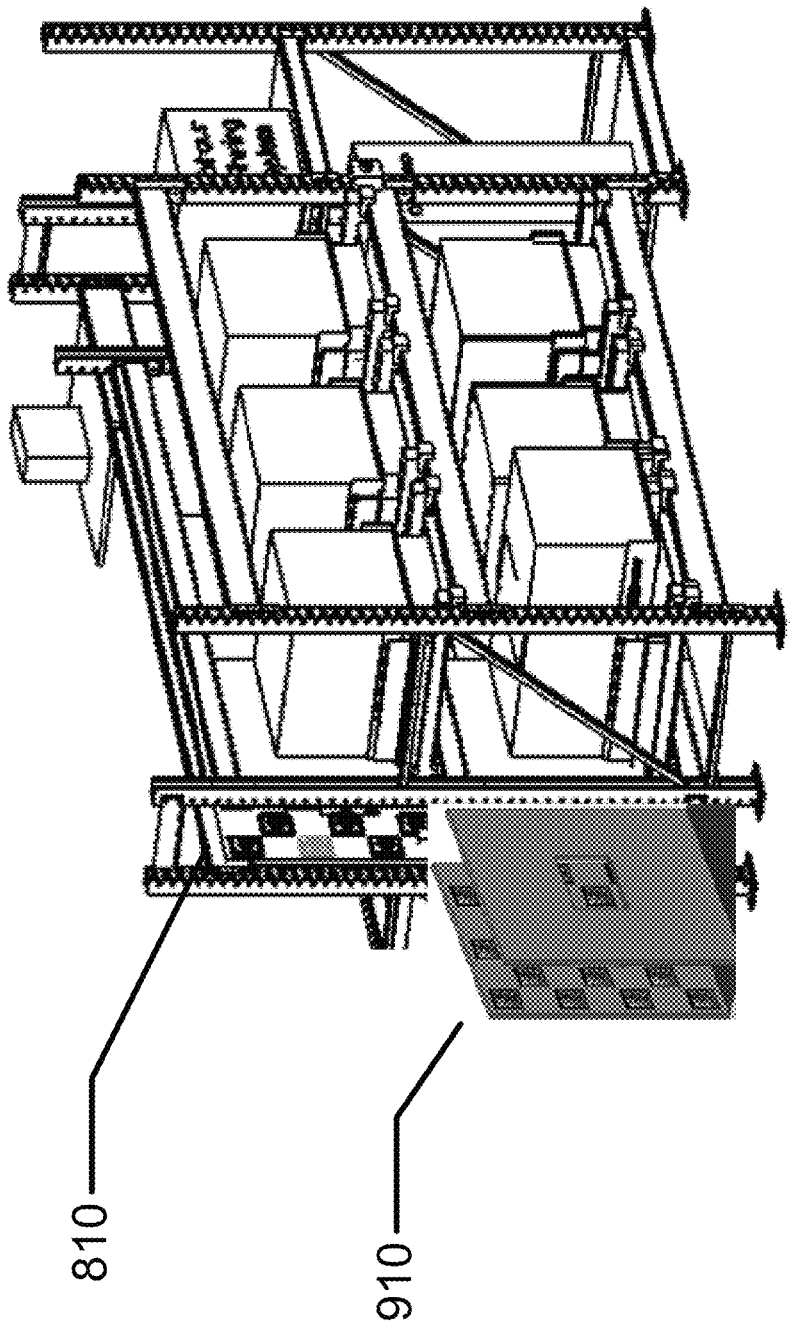
FIG. 9 illustrates alternative for mounting an airflow panel in exemplary multilevel fabricator designs.

In any of these examples it may be desirable to allow for flexible configuration of the filter panels and ready changing of the panels. Referring to FIG. 9, an example of a panel change option is illustrated. An air source region 810 is depicted where a filter panel 910 may be installed from the end of the fabricator body. Panels may be slid into place from the side. In general, the fabricator may be expected to idle during such a change out since the filtering integrity of at least the region in change is compromised.

Figure 10:
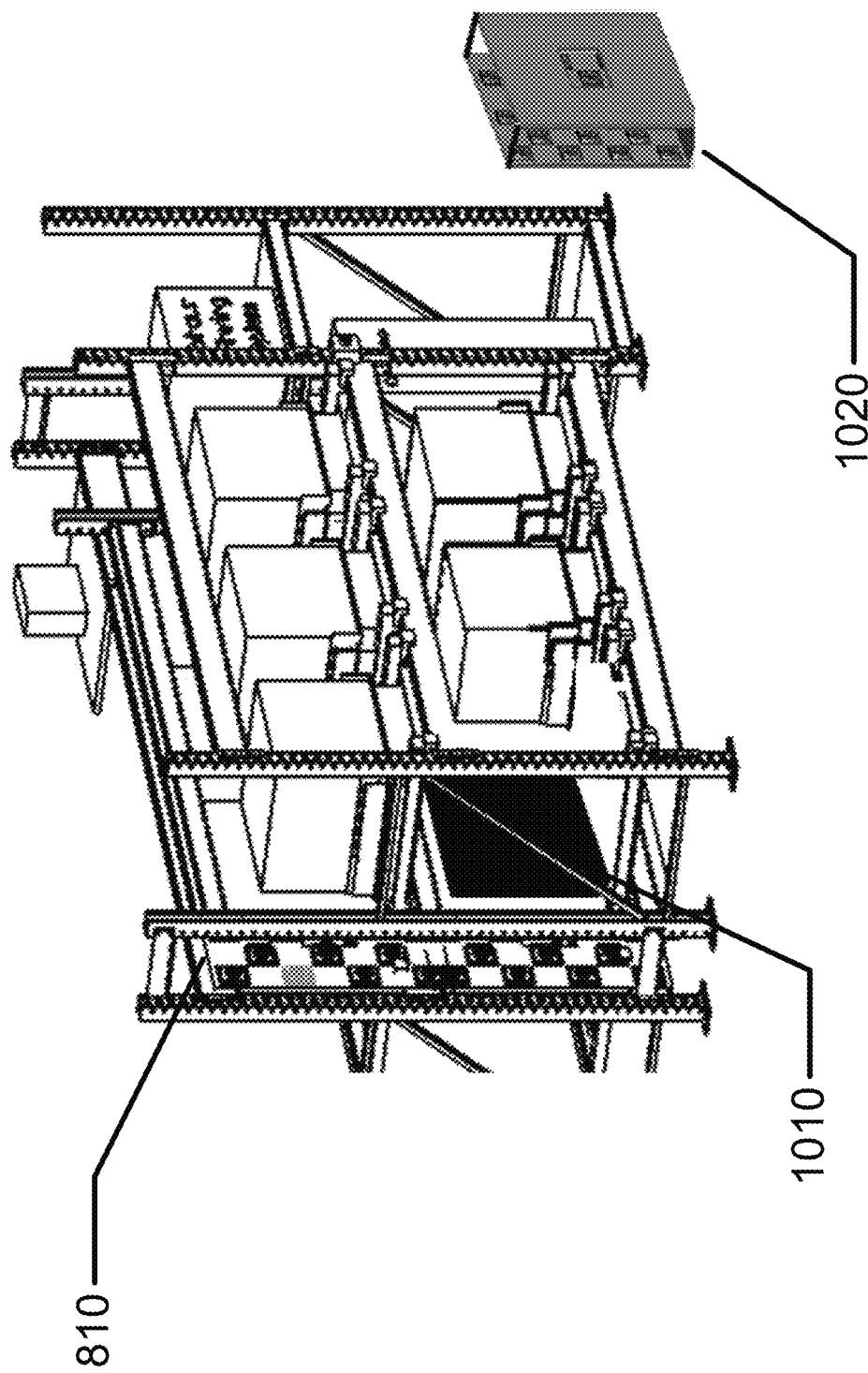
FIG. 10 illustrates another alternative for mounting an airflow panel in exemplary multilevel fabricator designs.

Another example may be observed in reference to FIG. 10. In this example, an air source region 810 again may have panels of filters and openings that align with processing tools and the ports of processing tools. In the example of FIG. 10, panels may be placed and removed from the tool side of the fabricator. An opening 1010 in the air source wall may be created by the removal of a panel. A replacement panel 1020 may then be placed from the tool side into the opening 1010.

Automated Tool Removal in Multilevel Fabricators

Traditionally, when installing a processing tool into a semiconductor fabricator, riggers had to place the tool in a designated position where the tool remained in place for its entire time in the fab. The present invention provides for an alternative strategy wherein processing tools can be routinely placed and removed from a fab location.

One aspect of the present invention therefore provides for support apparatus which facilitates efficient placement, removal and replacement of a processing tool in a predefined location. Predefined tool placement in turn facilitates predefined locations for utility interconnections and predefined locations for material transfer into and out of associated tool ports.

In some embodiments, a support fixture can further provide a chassis capable of receiving a processing tool and moving a processing tool from a position external to a cleanspace to an operational location. In some respects, movement of the tool from an installation position to an operational position can be envisioned much like a cabinet drawer moving from an outward position to a closed position.

Other aspects of some embodiments of the present invention include the connection of support items for proper operation of the processing tool. For example, electrical supplies, chemicals, gases, compressed air or other processing tool support can be passed through the tool chassis support system via flexible connections. Furthermore, the chassis body could support wired or wireless transfer of data. In addition, in some embodiments, a support chassis according to the present invention can include communication interfaces with safety systems to provide safe operation and safe removal and replacement.

It is the general intent of this invention to provide the physical framework for the support of locating processing tools in a fab where the tools are placed and replaced with some frequency and most or all of the tools are accessible from the exterior of the fabricator cleanspace and may be placed and replaced automatically. One aspect of a design that accomplishes these goals includes stacking tools in a vertical dimension to form a matrix. The scope of the present invention can include a matrix of a single column of fabrication tools ascending in a vertical dimension or a matrix including multiple columns of fabrication tools which adds horizontal dimension greater than one. The present invention supports both matrix designs with methods and apparatus which provide a cleanspace elevator that can lift tool bodies multiple levels in a clean environment. In various embodiments, the cleanspace elevator also provides transport in a horizontal dimension and maintains a clean space environment around a fabricator tool being transported.

Figure 11:
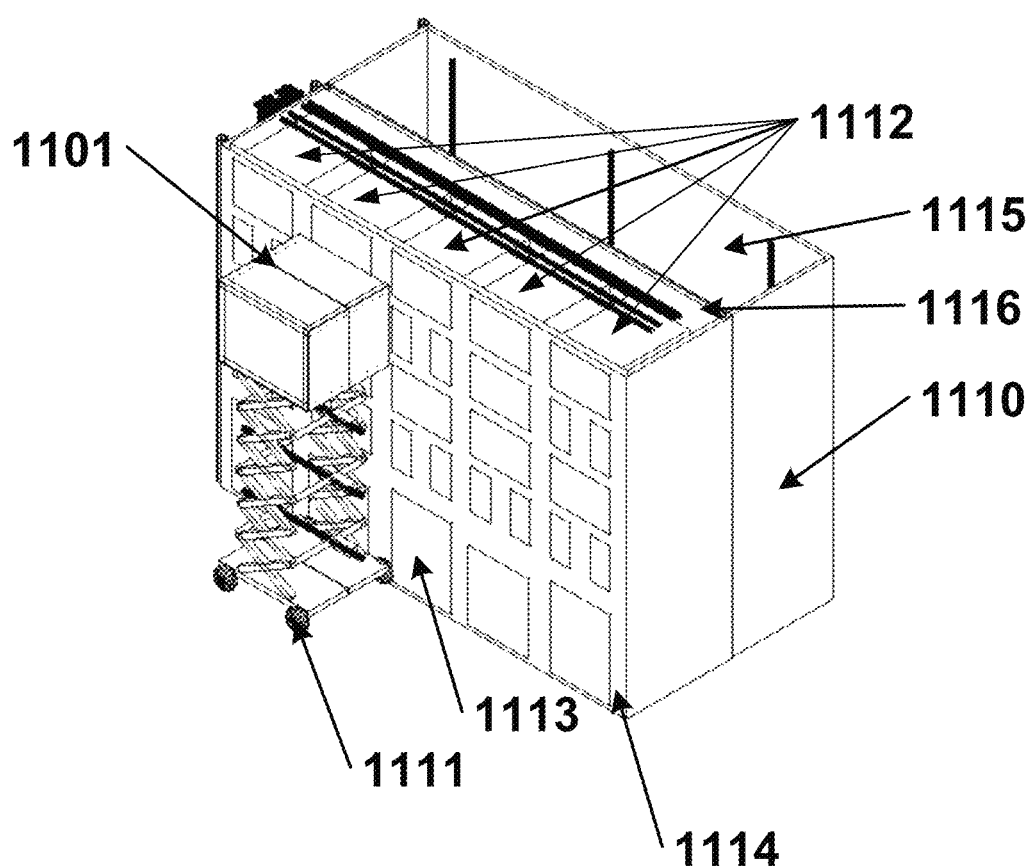
FIG. 11 illustrates a standalone elevation cleanspace deployed next to a straight edged multilevel fab.

In FIG. 11, various aspects of this invention are illustrated. An elevator body 1101 is indexed on a $4^{th}$ level of a multilevel cleanspace fabricator 1110 at the second major tool location in the horizontal dimension. A fabricator 1110 is therefore illustrated of a type where each tool body (not illustrated in FIG. 11) is located in a disparate cleanspace 1112.

According to some embodiments, each tool body 1112 has a corresponding access panel 1113 which can be removed to facilitate work on the corresponding tool body or replace the entire tool. In some embodiments the access panel may be withdrawn automatically. In order to support such an arrangement, a mobile elevated cleanspace 1101 is provided which can be elevated and positioned proximate to a particular fabricator tool corresponding cleanspace regions 1115, 1116 and cleanspace periphery 1114. The elevator can move in the horizontal dimension by a motor driven set of wheels as shown by item 1111.

There are a number of types of cleanspace fabricators that may be possible with different orientations. For the purposes of illustration an exemplary type where the fab shape is planar, as FIG. 11 demonstrated, with tools oriented in vertical orientations may be used. An exemplary representation of what the internal structure of these types of fabs may look like is shown in a partial cross section representation in FIG. 12, item 1200. Item 1210 may represent the roof of such a fabricator where some of the roof has been removed to allow for a view into the internal structure. Additionally, items 1220 may represent the external walls of the facility which are also removed in part to allow a view into external structure.

Figure 12:
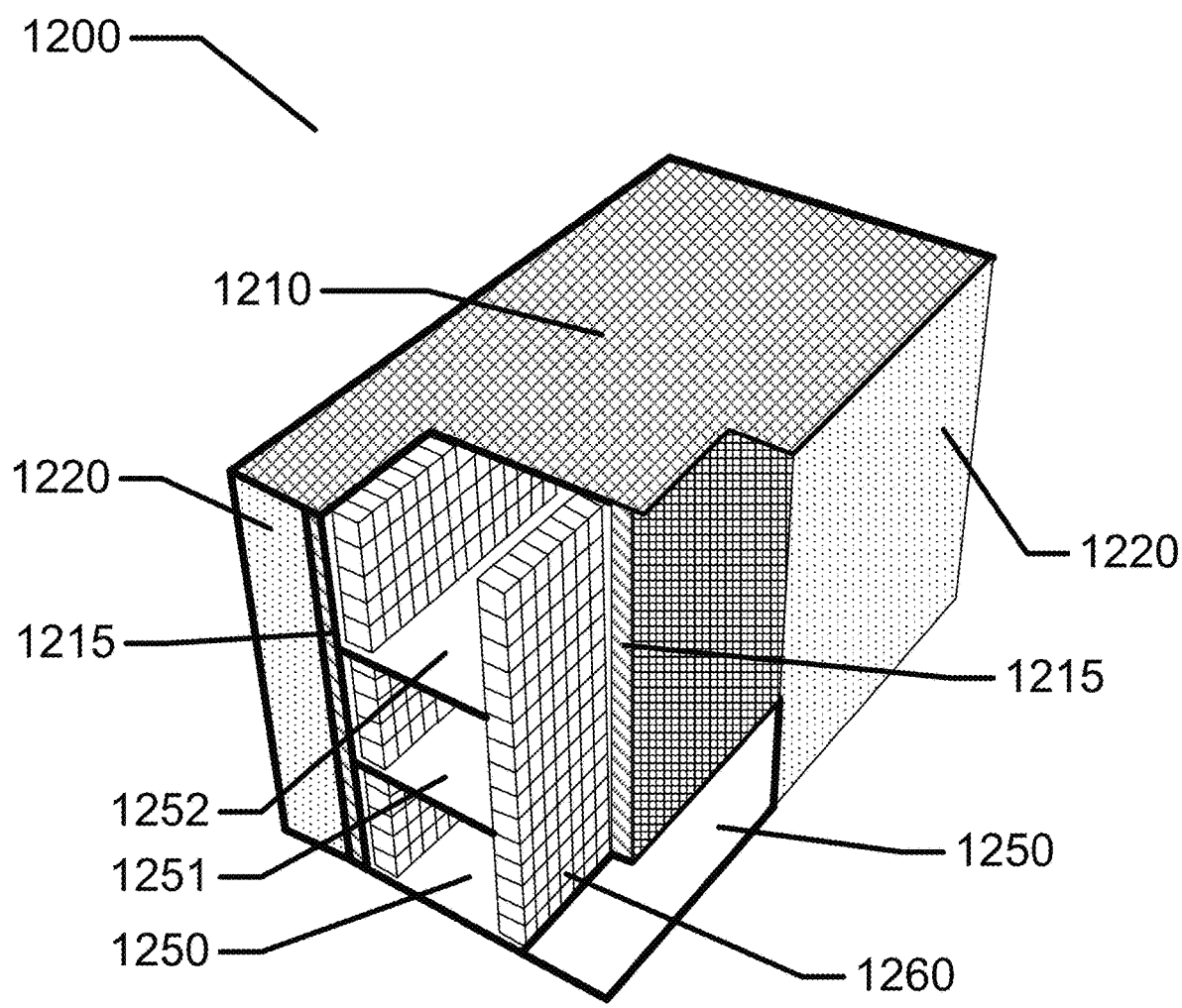
FIG. 12 illustrates an exemplary multilevel cleanspace fabricator.

In the linear and vertical cleanspace fabricator of FIG. 12 there are a number of aspects that may be observed in the representation. The "rotated and shrunken" cleanspace regions may be observed as items 1215. The occurrence of item 1215 on the right side of the figure is depicted with a portion of its length cut off to show its rough size in cross section. The cleanspaces lie adjacent to the tool pod locations. Depicted as item 1260, the small cubical features represent tooling locations within the fabricator. These locations are located vertically and are adjacent to the cleanspace regions (1215). In some embodiments a portion of the tool, the tool port, may protrude into the cleanspace region to interact with the automation that may reside in this region.

Items 1250 may represent the fabricator floor or ground level. On the right side, portions of the fabricator support structure may be removed so that the section may be demonstrated. In between the tools and the cleanspace regions, the location of the floor 1250 may represent the region where access is made to place and replace tooling. In this region, automated tool removal systems may be located.

In some embodiments, as in the one in FIG. 12, there may be two additional floors that are depicted as items 1251 and 1252. Other embodiments may have now flooring levels and access to the tools is made either by elevator means or by robotic automation that may be suspended from the ceiling of the fabricator or supported by the ground floor and allow for the automated removal, placement and replacement of tooling in the fabricator.

There may be various aspects a tool replacement system. The tool replacement system can have a box like body defined in three dimensions by walls. The interior can be maintained as a cleanspace area according to industry standards. For example, a HEPA filter based clean room ceiling can provide laminar type air, and a perforated floor, to allow for flow of air out of the elevated clean room. Controls can be situated inside the tool replacement system which a human operator inside the tool replacement system can use to control elevation and movement of the in the horizontal direction. In some embodiments aspects of the control may be automated and operate without a human operator.

In some embodiments, the area inside the tool replacement system can be sufficient for two or more tool bodies, so that a tool body being replaced can be removed from its place and a replacement tool body can be placed in the tool location cleanspace.

In some embodiments, elevation can be performed with mechanical structure operating on the principal of a scissor jack, such as, for example, via individual lead screw motors. Some embodiments can also include horizontal motion controlled via electric motors connected to a wheel based drive train. Other embodiments can include a rail system which guides a tool replacement system to a tool location via a matrix or collection of rails positioned in horizontal and/or vertical directions relative to the tool location. The use of overhead or on floor rail systems may also support the function of automated operation of tool changing operations. There may be mechanized apparatus that may be operative to position the processing tool in an operation location, wherein the mechanized apparatus may be a portion of the tool replacement system or a chassis system that may reside in the region comprising tools in the fabricator or both.

In another aspect, walls of the cleanspace which include an opening can be fitted with edge seals which can allow the elevator to be pushed against the fabricator to maintain a level of air cleanness when the vertical laminar flow air was actuated. The edge seals may be positioned with alignment fixtures located on the work module that allow for a reasonably precise docking in an appropriate location for tool replacement. In some embodiments the entire space of the elevated tool replacement system may be operated in a cleanspace environment.

In some embodiments the design of such an elevator tool replacement system may also accommodate various types of support facilities. These can include the electric power to not only run the elevator and cleanspace equipment but to potentially power elements of the tool bodies and testing/diagnostic equipment which can be incorporated into the elevator body. And, there can be automation capabilities incorporated into the elevator for transfer of data from tool bodies and test systems and the control equipment of the elevator itself to external automation systems, for example of the fab or of the tool bodies in the fab. Furthermore, since the operation of processing equipment involves various high energy sources, it can be natural for the elevated space to accommodate other safety apparatus like fire detection and remediation equipment and personnel safety monitoring equipment.

In some embodiments, utility services such as electrical power, data communication service, chemical supply, inert gas supply, compressed air, deionized water, chilled water, chemical drains, waste removal service and the like can be automatically connected, such as, for example, via a multi-port flange.

There may be various embodiments of the present invention relating to different manners of elevating the tool replacement system. For example, as opposed to the previously discussed elevator, in some embodiments, the elevator can be affixed to the frame of a vertical cleanspace fabricator. In such embodiments, a frame can support a set of elevator motors at the top of the fabricator. The tool replacement system can be very similar in other ways than the elevation system. A tool replacement system may include the frame which can be elevated in its entirety by a series of motor driven cables and pulleys.

Figure 13:
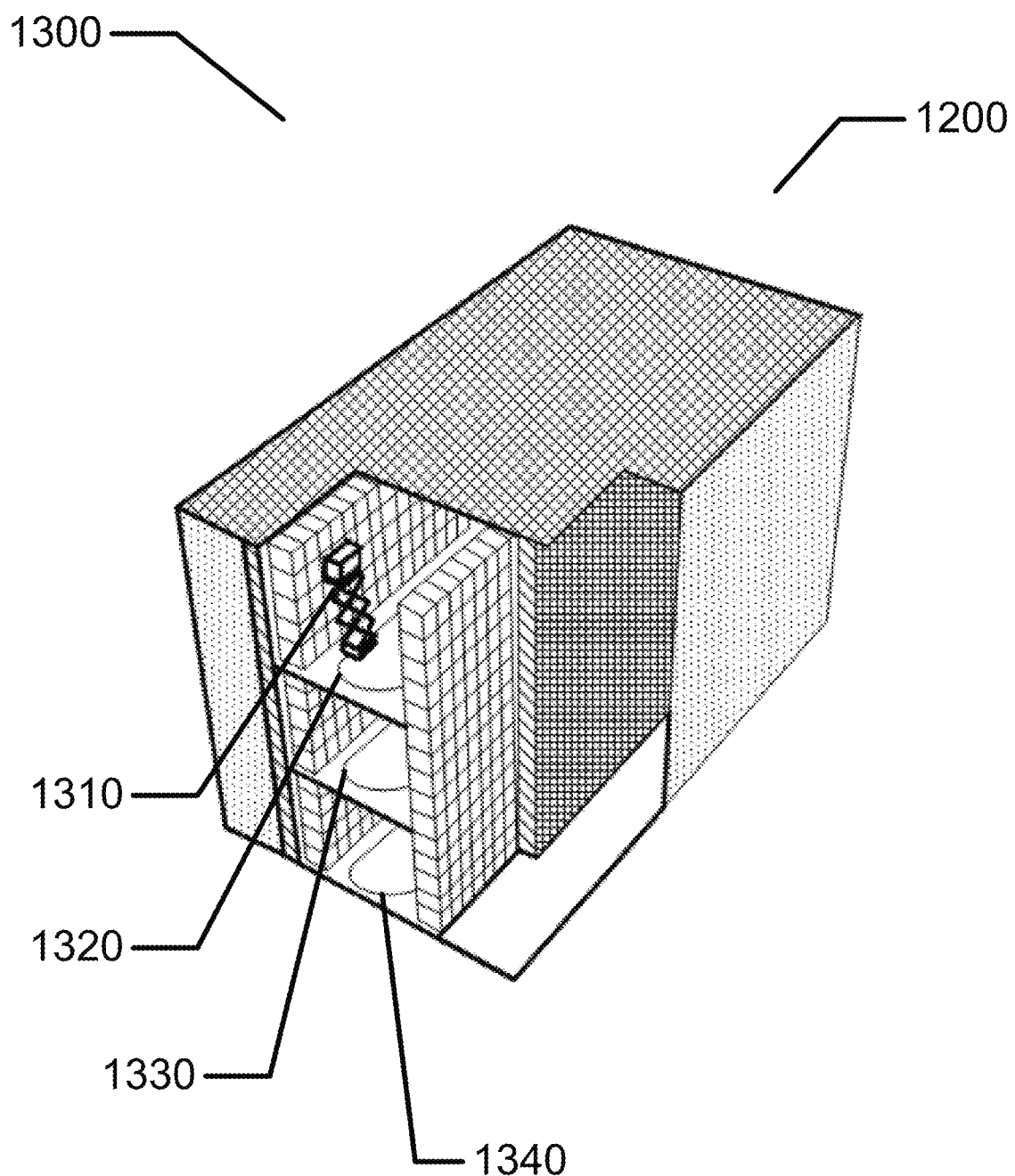
FIG. 13 illustrates tool handling robotics on a track system in the exemplary cleanspace fabricator type of FIG. 12.

Proceeding to FIG. 13, item 1300 an embodiment similar to that depicted in FIG. 11 may be found in the fab type of FIG. 12, item 1200. The fab may have three internal levels where each of the levels may have a track for guiding the tool replacement system item 1310, along items 1320, 1330 and 1340. The depicted tracks may proceed in a space large enough for a track on each side of the interior space. Other embodiments may have a reduced sized space such that a tool replacement system on a track down the middle can address tools on either sides. The elevator system of 1310 may operate in automated manners and in some embodiments it may be able to operate without a track in a similar fashion to with a track, where automated guidance will keep the tool replacement system on a correct trajectory.

Figure 14:
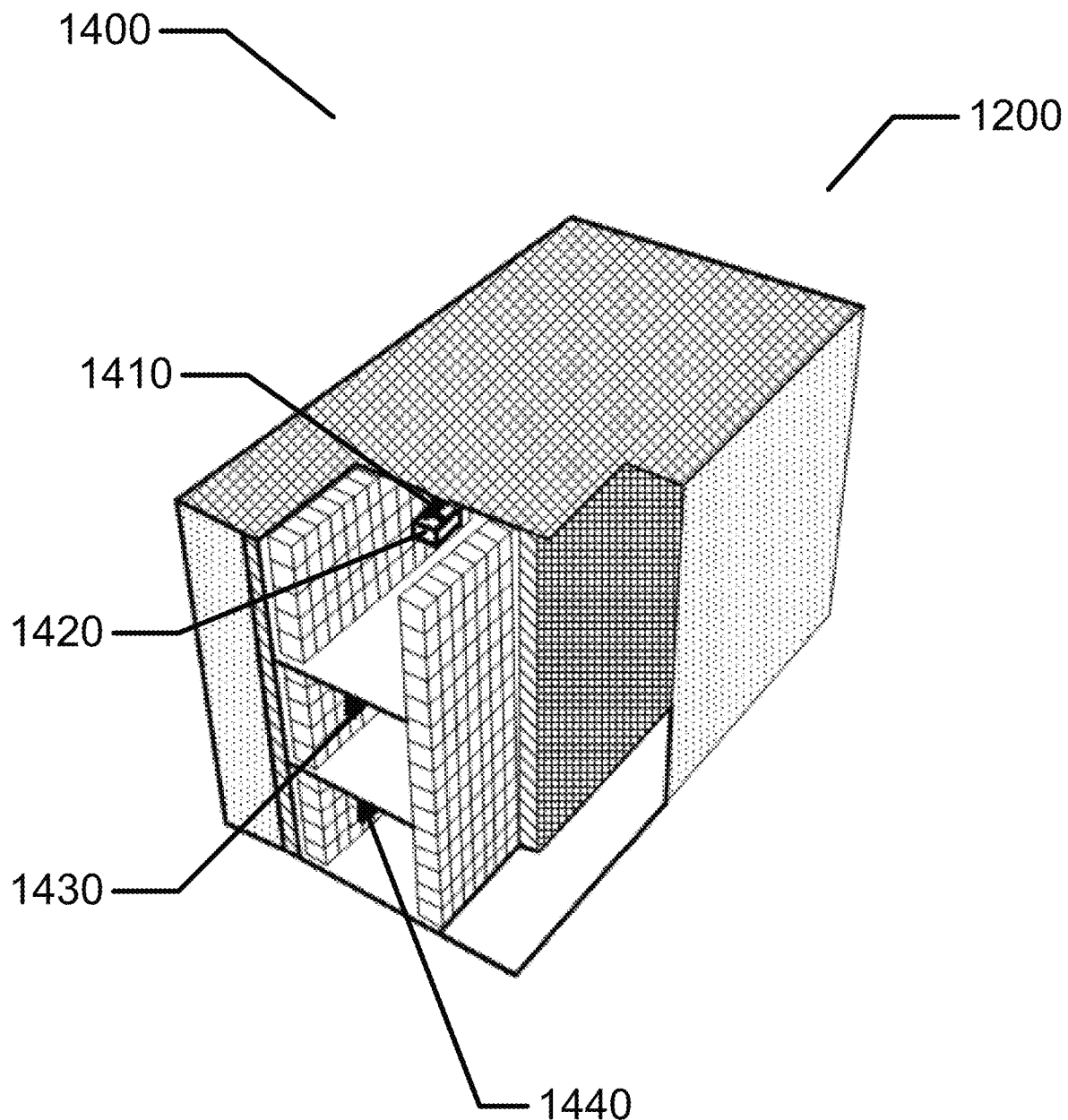
FIG. 14 illustrates tool handling robotics on a ceiling rail system in the exemplary cleanspace fabricator type of FIG. 12.

An alternative embodiment may be observed in FIG. 14, item 1400. Again, using the exemplary Cleanspace Fabricator design of item 1200 a tool replacement system may be oriented and guided by a track system oriented on a ceiling of each level. Item 1410 may be a ceiling mounted track system along which a tool replacement system, item 1420 may be guided. The depiction shows a single rail support, but other embodiments may use more than one rail. And, the tool replacement system may move from side to side to address tools on either side of the fab, which may be facilitated by multiple rails on the ceiling to distribute the forces as the tool replacement system moves and takes on the mass of tool bodies. The example of FIG. 14 depicts three levels with exemplary rails shown as item 1430 and 1440.

Figure 15:
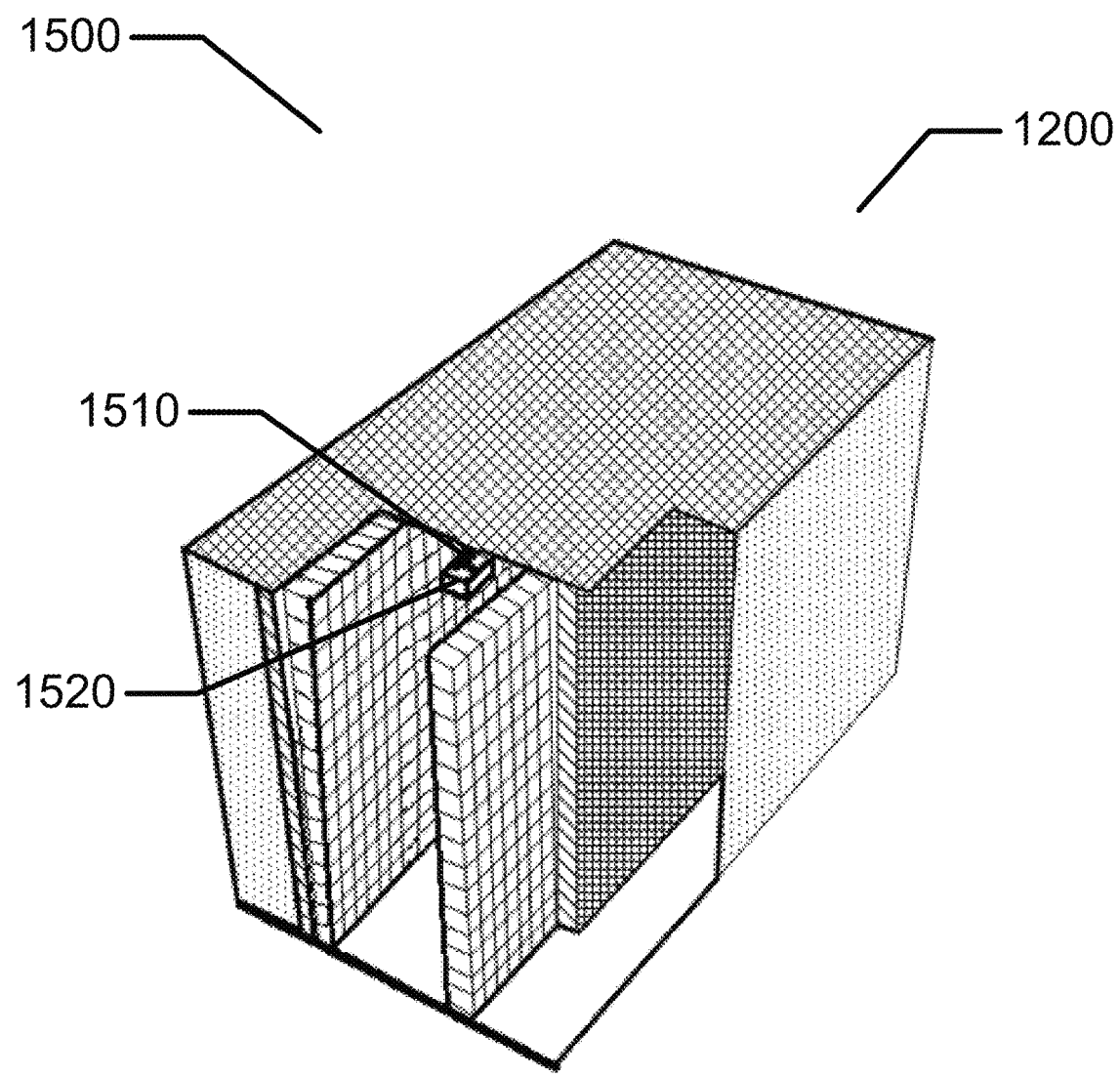
FIG. 15 illustrates another example of tool handling robotics on a ceiling rail system in a multilevel cleanspace fabricator with multiple tool levels but a single fab ceiling and floor level.

A still further embodiment may be found by proceeding to FIG. 15, item 1500. A single level fabricator with vertically stacked and located tool bodies may be addressed by a single ceiling located track support system, item 1510. A tool replacement system may be located as item 1520.

Figure 16:
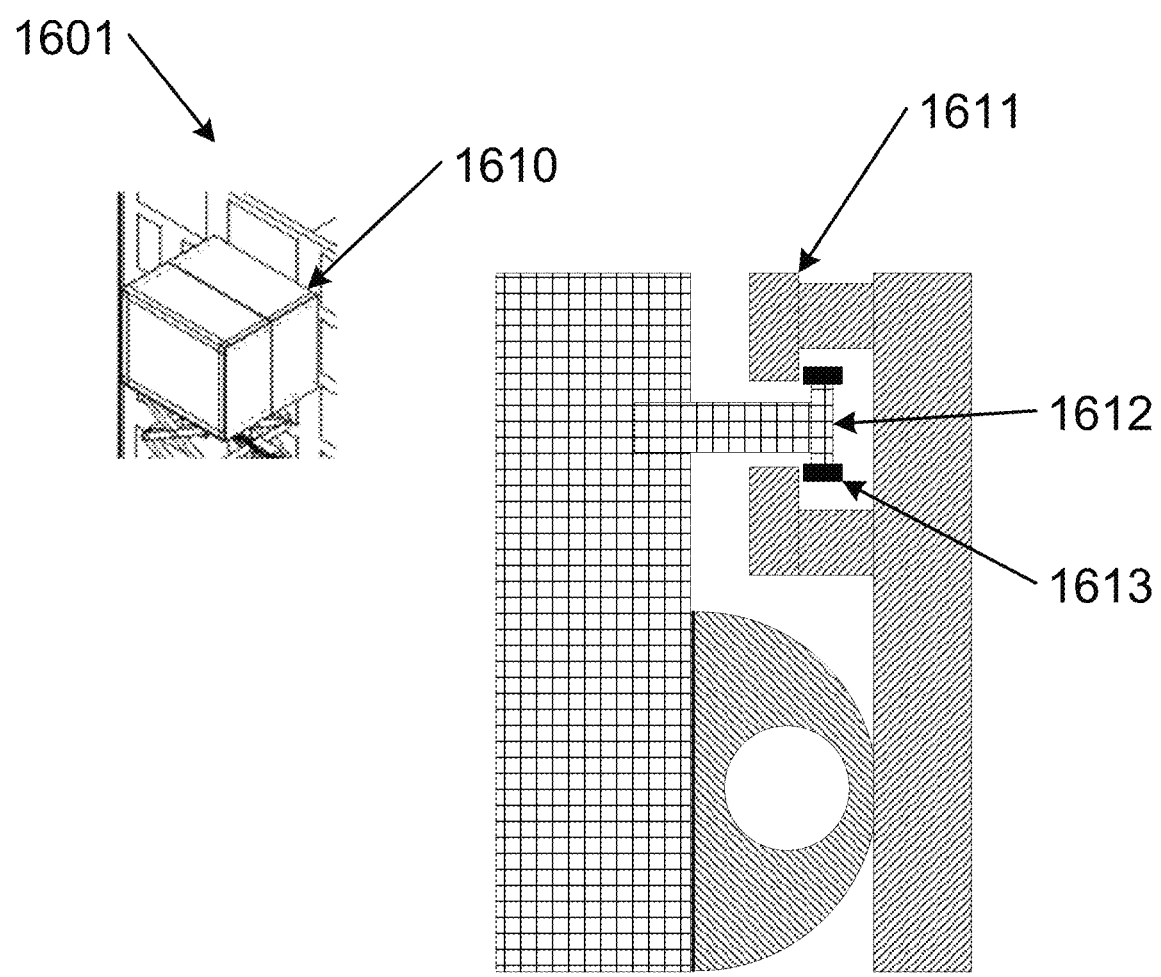
FIG. 16 illustrates a close up of exemplary edge sealing and alignment of tool handling robotics.

Since the support systems of the tool replacement system can service elevated heights, it can be prudent for support systems to be equipped with the capability to connect with the fabricator support structure in a flexible yet strong manner. Referring now to FIG. 16, such a structure is shown. In the exemplary embodiments illustrated in FIG. 16, an elevator body, 1601, has a sealing edge 1610, capable of connecting against the external face of the fabricator space.

In a region near this seal 1610, the fabricator space can have an external rail slot mounted on the face of the wall. In some embodiments, a slot can begin at the second level of an elevator space. Therefore, when the elevator 1501 is being put into service, it can be aligned with a desired position in the horizontal dimension. A tab, 1612, with wheels, 1613, on the elevator can be aligned with the slot, 1611, and the elevator can be elevated to its desired vertical position. If there happened to be a deflection of the elevator body away from the fab wall, it can then be captured by this slot and tab and not deflect significantly for safety reasons. The slot and tab mechanisms may also be used to guide alignment of the tool replacement system relative to tool bodies; especially when the tool removal system is designed to operate in an autonomous mode.

In some embodiments, as a processing tool is connected, various aspects of tool automation electronics can monitor the connection and determine when the connections are in a safe operating mode. For example fire detection and remediation equipment can be included in the elevated tool replacement system module. In addition, tool automation electronics can communicate with a tool body and to the tool chassis to identify a state that the connections and supply conduits are in.

In still another aspect of the invention, in some embodiments, control automation can be contained within one or more of: the elevator apparatus and the tool replacement system module for various aspects of the operation of the systems and apparatus described herein. It is also within the scope of the present invention to automatically monitor and control multiple states related to the tool replacement systems 1101, 1310, 1420 and 1520 via electronic circuitry included in the tool replacement system. Such states can include, by way of example, a physical location of the tool replacement system and whether an associated chassis at a tool location is in an extended or closed state.

Therefore, for example, if a processing tool and chassis are in a closed state, a technical operator can issue a command to the chassis to move to an extended position in order to provide access to a tool mounted to the chassis as a tool replacement system becomes proximate to the chassis. In some embodiments the command may be issued in an automated fashion. Such communication can occur through a control panel or through wireless communication to the chassis through circuitry comprising wireless receivers. Accordingly, control of the tool replacement system 501, an elevator, a processing tool, or any of the other systems describe herein can be accomplished with any known machine controller technology, including for example a processor running executable software and generating a human readable interface.

In some embodiments, a command to move to the chassis to an extended location can also initiate, amongst other algorithmic functions, a check for the status of utilities connections. It is also within the scope of this invention to require any such utility connections to be rendered into a state of disconnect before the chassis can proceed to an extended position.

Similarly, in some embodiments, prior to operations such as extension of a chassis, processing steps can determine that a tool body did not contain any substrates prior to extension of the chassis. It is also within the scope of the present invention for communication modes included within the chassis to communicate with fabrication wide automation systems for purposes such as tracking the location of substrates; tracking the identity of tools; and tracking the status of tools. If connections to a tool and chassis are in a proper state then an elevator can approach the tool location of a particular chassis and the chassis can move into an extended position allowing, for example, for the removal of a tool contained therein and replacement with another tool body.

As described above, according to various embodiments of the present invention, each tool body can be individually removed and replaced in a standardized process and without requiring the removal of adjacent tool bodies. In addition, some embodiments provide for a fabrication tool to be maintained within a clean space environment during any of: removal, repair, transport and replacement. In still another aspect, some embodiments provide for the automatic removal of a tool from a first tool location and automatic placement of the tool in a second tool location, wherein all utilities connections are also automatically disconnected and reconnected accordingly.

In other embodiments, movement of a fabrication tool may be facilitated by a robotic tool handler. Essentially, a robotic tool handler can provide handling capabilities difficult or impossible for a human to perform. Accordingly, the robotic tool handler may provide one or more of: a degree to work force not generally available via human strength and a control of a degree of motion and stability not sustainable by direct human interaction. A robotic tool handler may be too heavy or awkward for a human to move into position to interact with a tool. Therefore the present invention provides a mechanism to move the robotic tool handler in one or both of a vertical and horizontal manner may be nearly identical to those embodiments describe herein and used to move a work area with three walls. In these embodiments however, the robotic handler may interface with tooling without the protective environment of the work area. Some of these embodiments may be enabled by having a tool chassis system that will isolate a tools location from the fabricator Cleanspace while any transfer of tools is occurring. In this manner, sealing a clean environment around the location of the tool body may not be required.

In embodiments where the robotic tool handler is used instead of a work area, the tool handler may have similar automation definitions to allow it to coordinate with a tool body that is intended to be removed. The tool body may move in an automated fashion to be in a location where the robotic tool handler may mechanically interface with it and move it physically. After removing a tool body and positioning it in a resting location, the robotic tool handler may interface to a replacement tool in an alternative resting location and move it. The replacement tool body may then be placed into the fabricator tool location vacated by the first tool.

Further embodiments may derive with robotic tool handlers. It may be apparent to one skilled in the art that numerous configurations of robotic machines may be consistent with moving tool bodies into and out of fabricator environments. In illustrative description of what may be apparent in the descriptions of the work area environment embodiments useful for moving and placing tools in various types of Cleanspace fabricators, a robotic tool handler may in fact reside within a tool replacement system. Such embodiments may facilitate the automated transfer of tools while maintaining a local Cleanspace environment around the transfer location during the transfer.

A different type of embodiment may derive using other concepts of Cleanspace fabricators. A Cleanspace fabricator may have multiple Cleanspace locations defined within itself. Prior patent disclosures have specifically defined a primary and secondary Cleanspace embodiment where the primary Cleanspace contains the embodiments for moving substrates from tool to tool. The secondary Cleanspace in these embodiments may contain the tool bodies and associated equipment. Additional Cleanspace locations may be possible. In a non-limiting example of this concept, a tertiary Cleanspace may be defined to contain the embodiments to facilitate the automated transfer of tooling in a defined environment.

Figure 17:
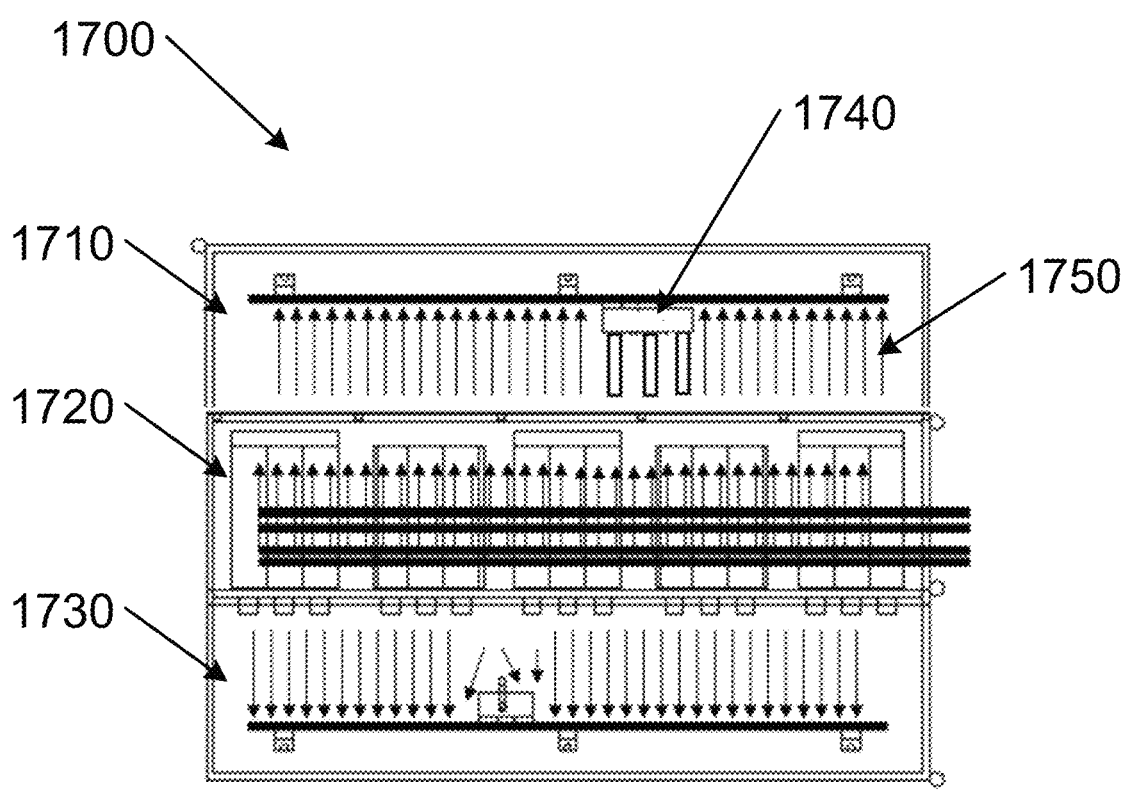
FIG. 17 illustrates a tertiary clean space for tool handling robotic area from a plan view.

Referring to FIG. 17, item 1700 a tertiary Cleanspace may be seen as item 1710. For illustrative purposes, one embodiment is where the airflow continues from the secondary Cleanspace 1720 and then through the tertiary cleanspace. A primary Cleanspace 1730 is shown for reference. In the tertiary Cleanspace 1710 a unidirectional airflow 1750 may be maintained. It is in this space that the automated transfer of tool bodies may occur with a tool replacement system 1740.

Some embodiments of the present invention which relate to the specific application of semiconductor fabrication have been described in order to better demonstrate various useful aspects of the invention. However, such exemplary descriptions are not meant to limit the application of the inventive concepts described herein in any way. Embodiments may therefore include, for example, applications in research and generation of: pharmaceutical products, nanostructure products and other applications which benefit from the availability of cleanspace and multiple processing tools.

Glossary of Selected Terms

Air receiving wall: a boundary wall of a cleanspace that receives air flow from the cleanspace.

Air source wall: a boundary wall of a cleanspace that is a source of clean airflow into the cleanspace.

Annular: The space defined by the bounding of an area between two closed shapes one of which is internal to the other.

Automation: The techniques and equipment used to achieve automatic operation, control or transportation.

Ballroom: A large open cleanroom space devoid in large part of support beams and walls wherein tools, equipment, operators and production materials reside.

Batches: A collection of multiple substrates to be handled or processed together as an entity Boundaries: A border or limit between two distinct spaces—in most cases herein as between two regions with different air particulate cleanliness levels.

Circular: A shape that is or nearly approximates a circle.

Clean: A state of being free from dirt, stain, or impurities—in most cases herein referring to the state of low airborne levels of particulate matter and gaseous forms of contamination.

Cleanspace: A volume of air, separated by boundaries from ambient air spaces, that is clean.

Cleanspace, Primary: A cleanspace whose function, perhaps among other functions, is the transport of jobs between tools.

Cleanspace, Secondary: A cleanspace in which jobs are not transported but which exists for other functions, for example as where tool bodies may be located.

Cleanroom: A cleanspace where the boundaries are formed into the typical aspects of a room, with walls, a ceiling and a floor.

Core: A segmented region of a standard cleanroom that is maintained at a different clean level. A typical use of a core is for locating the processing tools.

Ducting: Enclosed passages or channels for conveying a substance, especially a liquid or gas—typically herein for the conveyance of air.

Envelope: An enclosing structure typically forming an outer boundary of a cleanspace.

Fab (or fabricator): An entity made up of tools, facilities and a cleanspace that is used to process substrates.

Fit up: The process of installing into a new clean room the processing tools and automation it is designed to contain.

Flange: A protruding rim, edge, rib, or collar, used to strengthen an object, hold it in place, or attach it to another object. Typically herein, also to seal the region around the attachment.

Folding: A process of adding or changing curvature.

HEPA: An acronym standing for high-efficiency particulate air. Used to define the type of filtration systems used to clean air.

Horizontal: A direction that is, or is close to being, perpendicular to the direction of gravitational force.

Job: A collection of substrates or a single substrate that is identified as a processing unit in a fab. This unit being relevant to transportation from one processing tool to another.

Logistics: A name for the general steps involved in transporting a job from one processing step to the next. Logistics can also encompass defining the correct tooling to perform a processing step and the scheduling of a processing step.

Multifaced: A shape having multiple faces or edges.

Nonsegmented Space: A space enclosed within a continuous external boundary, where any point on the external boundary can be connected by a straight line to any other point on the external boundary and such connecting line would not need to cross the external boundary defining the space.

Perforated: Having holes or penetrations through a surface region. Herein, said penetrations allowing air to flow through the surface.

Peripheral: Of, or relating to, a periphery.

Periphery: With respect to a cleanspace, refers to a location that is on or near a boundary wall of such cleanspace. A tool located at the periphery of a primary cleanspace can have its body at any one of the following three positions relative to a boundary wall of the primary cleanspace: (i) all of the body can be located on the side of the boundary wall that is outside the primary cleanspace, (ii) the tool body can intersect the boundary wall or (iii) all of the tool body can be located on the side of the boundary wall that is inside the primary cleanspace. For all three of these positions, the tool's port is inside the primary cleanspace. For positions (i) or (iii), the tool body is adjacent to, or near, the boundary wall, with nearness being a term relative to the overall dimensions of the primary cleanspace.

Planar: Having a shape approximating the characteristics of a plane.

Plane: A surface containing all the straight lines that connect any two points on it.

Polygonal: Having the shape of a closed figure bounded by three or more line segments Process: A series of operations performed in the making or treatment of a product—herein primarily on the performing of said operations on substrates.

Production unit: An element of a process that is acted on by processing tools to produce products. In some cleanspace fabricators this may include carriers and/or substrates.

Robot: A machine or device that operates automatically or by remote control, whose function is typically to perform the operations that move a job between tools, or that handle substrates within a tool.

Round: Any closed shape of continuous curvature.

Substrates: A body or base layer, forming a product, that supports itself and the result of processes performed on it.

Tool: A manufacturing entity designed to perform a processing step or multiple different processing steps. A tool can have the capability of interfacing with automation for handling jobs of substrates. A tool can also have single or multiple integrated chambers or processing regions. A tool can interface to facilities support as necessary and can incorporate the necessary systems for controlling its processes.

Tool Body: That portion of a tool other than the portion forming its port.

Tool Port: That portion of a tool forming a point of exit or entry for jobs to be processed by the tool. Thus the port provides an interface to any job-handling automation of the tool.

Tubular: Having a shape that can be described as any closed figure projected along its perpendicular and hollowed out to some extent.

Unidirectional: Describing a flow which has a tendency to proceed generally along a particular direction albeit not exclusively in a straight path. In clean airflow, the unidirectional characteristic is important to ensuring particulate matter is moved out of the cleanspace.

Unobstructed removability: refers to geometric properties, of fabs constructed in accordance with the present invention that provide for a relatively unobstructed path by which a tool can be removed or installed.

Utilities: A broad term covering the entities created or used to support fabrication environments or their tooling, but not the processing tooling or processing space itself. This includes electricity, gasses, airflows, chemicals (and other bulk materials) and environmental controls (e.g., temperature).

Vertical: A direction that is, or is close to being, parallel to the direction of gravitational force.

While the invention has been described in conjunction with specific embodiments, it is evident that many alternatives, modifications and variations will be apparent to those skilled in the art in light of the foregoing description. Accordingly, this description is intended to embrace all such alternatives, modifications and variations as fall within its spirit and scope.

What is claimed is:

1. A method for forming a cleanspace fabricator; said method comprising:

constructing a building comprising a cleanspace fabricator structure wherein at least two flooring levels are configured within the building and wherein each flooring level comprises at least a primary cleanspace, wherein an air source provides air flow through the primary cleanspace in a direction from a first vertical wall to a second vertical wall and through at least a portion of the first vertical wall and through at least a portion of the second vertical wall;

placing a first processing tool into said cleanspace fabricator structure, wherein the first processing tool is one of a multitude of processing tools wherein each of the processing tools are placed into a position of vertically stacked processing tools within the each flooring level;

and configuring an automation system on the each flooring level to move production units from one processing tool to another, wherein for the each flooring level the automation system is configured on a ceiling of the primary cleanspace and interfaces with each of the vertically stacked processing tools of the each flooring level.

2. The method of claim 1 wherein:

removal of the first processing tool is at a periphery of the primary cleanspace.

3. The method of claim 1 additionally comprising:

moving a production unit from the first processing tool to a second processing tool.

4. The method of claim 1 additionally comprising:

moving a production unit from the first processing tool to a second processing tool wherein the second processing tool requires a movement in a vertical direction;

and wherein a tool body of the second processing tool is above a tool body of the first processing tool within a single flooring level.

5. The method of claim 1 further comprising:

performing at least a first process on a first production unit in at least the first processing tool.

* * * * *